United States Patent
Kao et al.

(10) Patent No.: US 11,355,339 B2
(45) Date of Patent: Jun. 7, 2022

(54) FORMING NITROGEN-CONTAINING LAYERS AS OXIDATION BLOCKING LAYERS

(71) Applicant: Taiwan Semiconductor Manufacturing Company, Ltd., Hsinchu (TW)

(72) Inventors: Wan-Yi Kao, Baoshan Township (TW); Chung-Chi Ko, Nantou (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 77 days.

(21) Appl. No.: 16/120,677

(22) Filed: Sep. 4, 2018

(65) Prior Publication Data

US 2020/0006065 A1    Jan. 2, 2020

Related U.S. Application Data

(60) Provisional application No. 62/691,901, filed on Jun. 29, 2018.

(51) Int. Cl.
*H01L 21/02* (2006.01)
*H01L 29/78* (2006.01)
(Continued)

(52) U.S. Cl.
CPC .... *H01L 21/02362* (2013.01); *H01L 21/0217* (2013.01); *H01L 21/02164* (2013.01); *H01L 21/02532* (2013.01); *H01L 21/324* (2013.01); *H01L 21/76224* (2013.01); *H01L 29/66545* (2013.01); *H01L 29/66795* (2013.01); *H01L 29/7851* (2013.01)

(58) Field of Classification Search
CPC ......... H01L 21/02337; H01L 21/02362; H01L 28/56; H01L 28/57; H01L 29/788; H01L 21/02126
See application file for complete search history.

(56) References Cited

U.S. PATENT DOCUMENTS 6,380,056 B1 * 4/2002 Shue ................. H01L 21/28185
                                                            438/591
7,425,480 B2    9/2008 Ozawa et al.
(Continued)

FOREIGN PATENT DOCUMENTS

JP    H08330584 A    12/1996
JP    2001015753 A    1/2001
(Continued)

OTHER PUBLICATIONS

Moslehi, et al., "Thermal Nitridation of Si and SiO2 for VLSI," IEEE Journal of Solid-State Circuits, vol. SC-20, No. 1, Feb. 1985, pp. 26-43.

*Primary Examiner* — Marcos D. Pizarro
*Assistant Examiner* — Quinton A Brasfield
(74) *Attorney, Agent, or Firm* — Slater Matsil, LLP

(57) ABSTRACT

A method includes forming a silicon layer on a wafer, forming an oxide layer in contact with the silicon layer, and, after the oxide layer is formed, annealing the wafer in an environment comprising ammonia ($NH_3$) to form a dielectric barrier layer between, and in contact with, the silicon layer and the oxide layer. The dielectric barrier layer comprises silicon and nitrogen.

20 Claims, 19 Drawing Sheets

(51) Int. Cl.
  *H01L 29/66* (2006.01)
  *H01L 21/324* (2006.01)
  *H01L 21/762* (2006.01)

(56) References Cited

U.S. PATENT DOCUMENTS

| | | | |
|---|---|---|---|
| 7,642,616 B2 | 1/2010 | Goda | |
| 8,487,378 B2 | 7/2013 | Goto et al. | |
| 8,729,634 B2 | 5/2014 | Shen et al. | |
| 8,796,666 B1* | 8/2014 | Huang | H01L 29/785 |
| | | | 257/18 |
| 8,815,712 B2 | 8/2014 | Wan et al. | |
| 8,826,213 B1 | 9/2014 | Ho et al. | |
| 8,887,106 B2 | 11/2014 | Ho et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,953,881 B2 | 4/2018 | Ching et al. | |
| 2010/0006918 A1* | 1/2010 | Ahn | H01L 21/28185 |
| | | | 257/316 |
| 2010/0078738 A1* | 4/2010 | Chambers | H01L 21/02337 |
| | | | 257/411 |
| 2010/0270604 A1 | 10/2010 | Lin et al. | |
| 2014/0282326 A1 | 9/2014 | Chen et al. | |
| 2015/0179783 A1 | 6/2015 | Mehrotra et al. | |
| 2015/0311067 A1* | 10/2015 | Sharma | H01L 21/28202 |
| | | | 438/783 |
| 2016/0163834 A1 | 6/2016 | Lee et al. | |
| 2017/0033199 A1 | 2/2017 | Wu et al. | |
| 2017/0317084 A1 | 11/2017 | Cantoro et al. | |
| 2017/0372969 A1 | 12/2017 | Ching et al. | |
| 2018/0151688 A1 | 5/2018 | Ching et al. | |
| 2018/0175214 A1 | 6/2018 | Chen et al. | |

FOREIGN PATENT DOCUMENTS

| | | |
|---|---|---|
| KR | 101769211 B1 | 8/2017 |
| TW | 201543572 A | 11/2015 |

* cited by examiner

FORMING NITROGEN-CONTAINING LAYERS AS OXIDATION BLOCKING LAYERS

PRIORITY CLAIM AND CROSS-REFERENCE

This application claims the benefit of the following provisionally filed U.S. patent application: Application Ser. No. 62/691,901, filed Jun. 29, 2018, and entitled "Forming Nitrogen-Containing Layers as Oxidation Blocking Layers;" which application is hereby incorporated herein by reference.

BACKGROUND

Transistors are basic building elements in integrated circuits. In previous development of the integrated circuits, Fin Field-Effect Transistors (FinFETs) are formed to replace planar transistors. In the formation of FinFETs, semiconductor fins are formed, and dummy gates are formed on the semiconductor fins. Gate spacers are formed on the sidewalls of the dummy gate stacks. The dummy gate stacks are then removed to form trenches between the gate spacers. Replacement gates are then formed in the trenches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
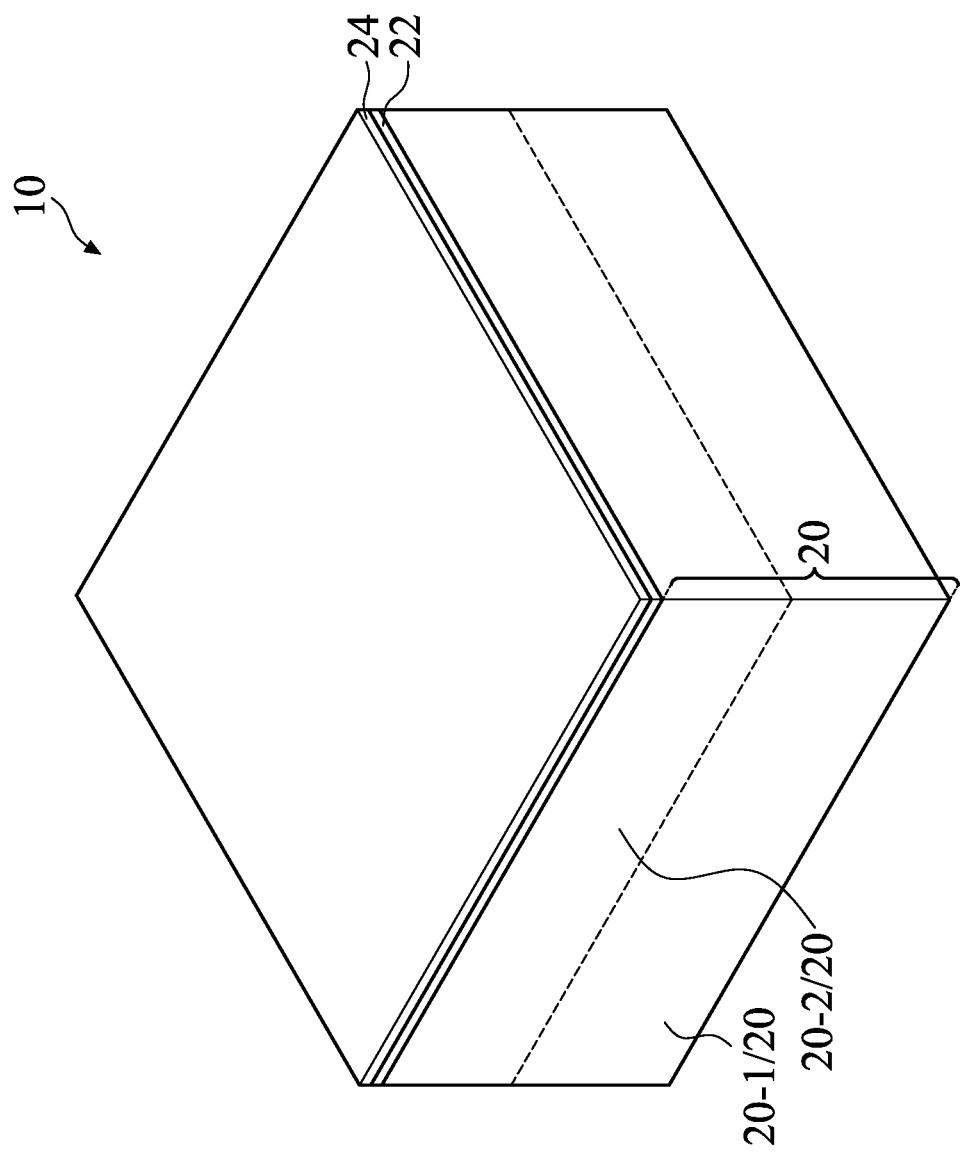
FIGS. 1 through 16 illustrate the cross-sectional views and perspective views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the method of forming the same are provided in accordance with some embodiments. The intermediate stages of forming the FinFET are illustrated in accordance with some embodiments. Some variations of some embodiments are discussed. Throughout the various views and illustrative embodiments, like reference numbers are used to designate like elements. In accordance with some embodiments of the present disclosure, silicon nitride mono layers are formed through annealing in ammonia. The silicon nitride mono layers are between oxide regions and semiconductor regions, so that the silicon nitride mono layers may protect the semiconductor regions from being oxidized, especially in subsequent anneal processes, during which oxygen may migrate to the semiconductor regions to cause the adverse oxidation of the semiconductor regions.

FIGS. 1 through 16 and FIGS. 17A and 17B illustrate the perspective views of intermediate stages in the formation of a FinFET in accordance with some embodiments of the present disclosure. The processes shown in FIGS. 1 through 16 and FIGS. 17A and 17B are also reflected schematically in the process flow 200 as shown in FIG. 18.

FIG. 1 illustrates a perspective view of an initial structure. The initial structure includes wafer 10, which includes substrate 20. Substrate 20 may further include substrate (portion) 20-1. Substrate 20-1 may be a semiconductor substrate, which may be a silicon substrate, a silicon germanium substrate, or a substrate formed of other semiconductor materials. Substrate 20-1 may also be a bulk substrate or a semiconductor-on-insulator substrate.

In accordance with some embodiments of the present disclosure, the illustrated region is a p-type device region, in which a p-type transistor such as a p-type Fin Field-Effect Transistor (FinFET) is to be formed. Epitaxy semiconductor layer 20-2 may be epitaxially grown on top of substrate 20-1 to form substrate 20. For example, epitaxy semiconductor layer 20-2 may be formed of silicon germanium (SiGe) or germanium (without silicon therein). The germanium atomic percentage in epitaxy semiconductor layer 20-2 may be higher than the germanium atomic percentage in substrate portion 20-1. In accordance with some embodiments of the present disclosure, the germanium atomic percentage in epitaxy semiconductor layer 20-2 (when formed of SiGe) is in the range between about 30 percent and 100 percent. Epitaxy semiconductor layer 20-2 may also be formed of SiP, SiC, SiPC, SiGeB, or a III-V compound semiconductor such as InP, GaAs, AlAs, InAs, InAlAs, InGaAs, or the like. Epitaxy semiconductor layer 20-2 may also be substantially free from silicon, for example, with a silicon atomic percentage lower than about 1 percent.

In accordance with some embodiments of the present disclosure, the illustrated region is a p-type device region, in which a p-type transistor such as a p-type FinFET is to be formed. Accordingly, epitaxy semiconductor layer 20-2 may be formed. In accordance with some embodiments of the present disclosure, the illustrated region is an n-type device region, in which an n-type transistor such as an n-type FinFET is to be formed. Epitaxy layer 20-2 may extend into the p-type device region. If an n-type FinFET is formed, the respective device region may not have the epitaxy layer 20-2 formed therein. The p-type device region and the n-type FinFET region may be on a same wafer and a same device die. Accordingly, a dashed line is drawn between substrate portions 20-1 and 20-2 to show that epitaxy layer 20-2 may or may not exist in the illustrated device region.

Pad layer 22 and mask layer 24 may be formed on semiconductor substrate 20. Pad layer 22 may be a thin film formed of silicon oxide. In accordance with some embodiments of the present disclosure, pad oxide layer 22 is formed in a thermal oxidation process, wherein a top surface layer of semiconductor substrate 20 is oxidized. Pad layer 22 acts as an adhesion layer between semiconductor substrate 20 and mask layer 24. Pad layer 22 may also act as an etch stop layer for etching mask layer 24. In accordance with some embodiments of the present disclosure, mask layer 24 is formed of silicon nitride, for example, using Low-Pressure Chemical Vapor Deposition (LPCVD). In accordance with other embodiments of the present disclosure, mask layer 24 is formed through thermal nitridation of silicon, Plasma Enhanced Chemical Vapor Deposition (PECVD), or plasma anodic nitridation. Mask layer 24 is used as a hard mask during subsequent photolithography processes.

Figure 2:
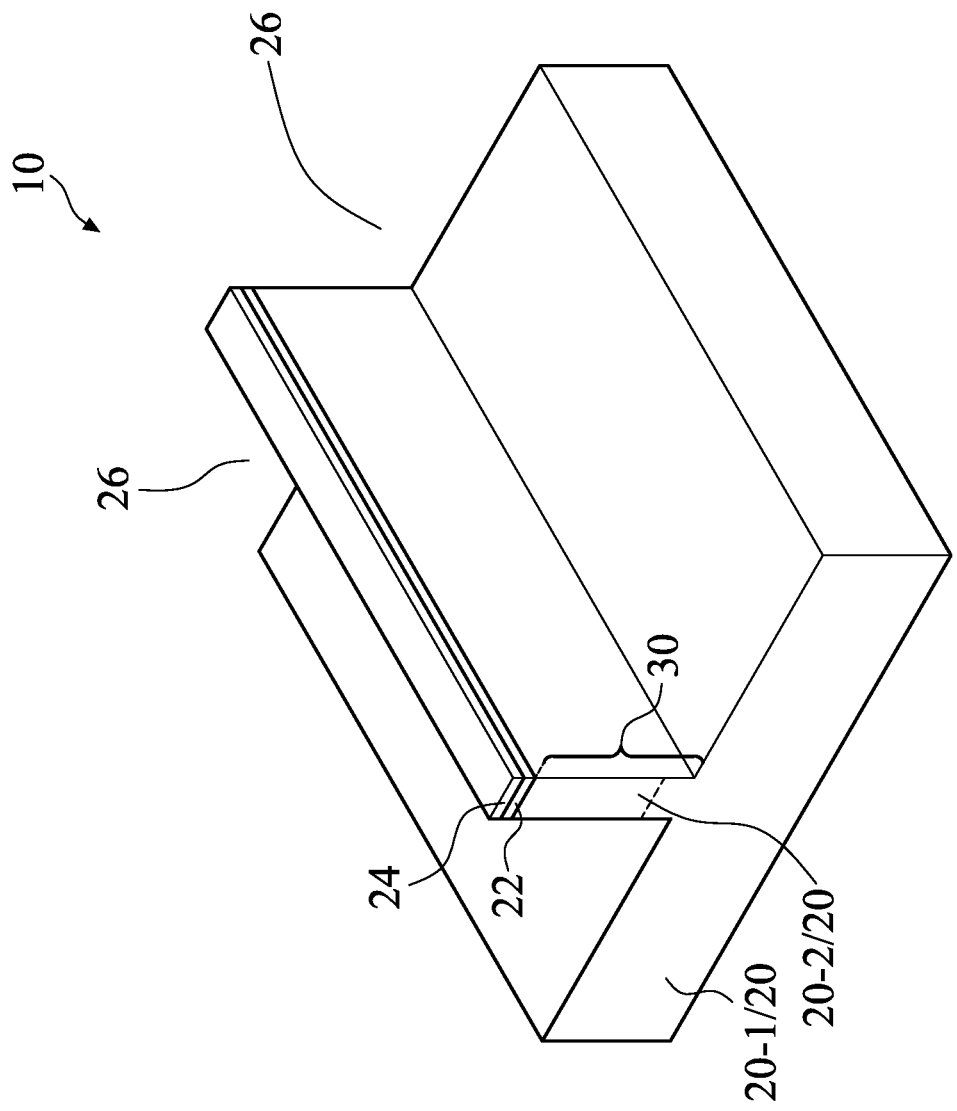

Referring to FIG. 2, mask layer 24 and pad layer 22 are etched, exposing underlying semiconductor substrate 20. The exposed semiconductor substrate 20 is then etched, forming trenches 26. The respective process is illustrated as process 202 in the process flow shown in FIG. 18. The portions of semiconductor substrate 20 between neighboring trenches 26 are referred to as semiconductor strip 30 hereinafter. Portions of trenches 26 may have the shape of strips (when viewed in the top view of wafer 10) that are parallel to each other, and trenches 26 are closely located from each other. In accordance with some embodiments of the present disclosure, the aspect ratio (the ratio of depth to width) of trenches 26 is greater than about 7, and may be greater than about 10. Although one semiconductor strip 30 is illustrated, a plurality of semiconductor strips may be formed as being parallel to each other, with trenches 26 separating the plurality of semiconductor strips from each other. In accordance with some embodiments in which epitaxy semiconductor layer 20-2 is formed, the bottoms of trenches 26 are lower than the interface 23 between substrate portion 20-1 and epitaxy semiconductor layer 20-2. Interface 23 is also the bottom surface of epitaxy semiconductor layer 20-2.

Figure 3:
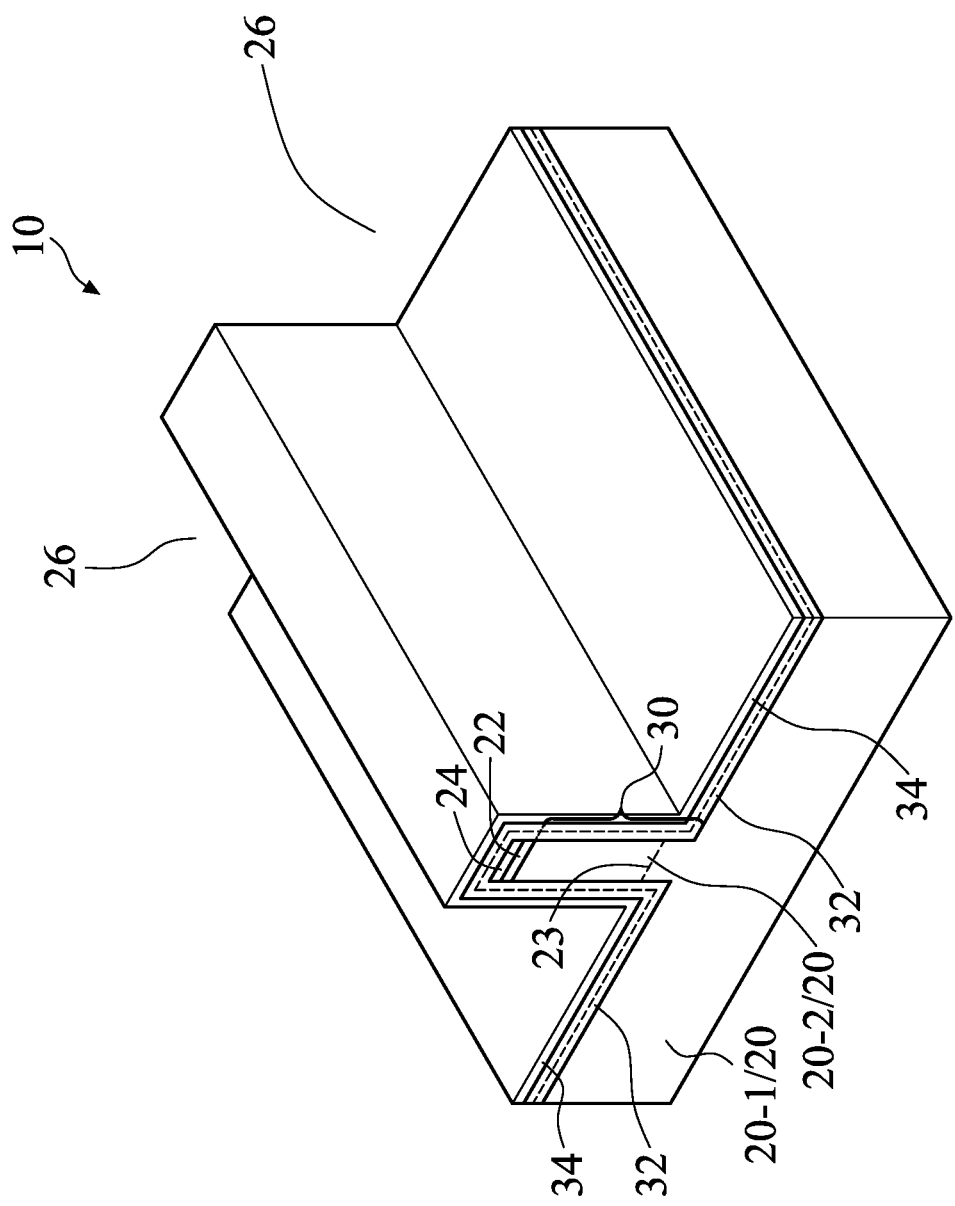

Referring to FIG. 3, silicon layer 32 is deposited in accordance with some embodiments of the present disclosure. The respective process is illustrated as process 204 in the process flow shown in FIG. 18. The deposition may be performed through a conformal deposition method such as Chemical Vapor Deposition (CVD). Silicon layer 32 may be free or substantially free from other elements such as germanium, carbon, or the like. For example, the atomic percentage of silicon in silicon layer 32 may be higher than about 95 percent. Silicon layer 32 may be formed as a crystalline silicon layer or a polysilicon layer, which may be achieved, for example, by adjusting the temperature and the growth rate in the deposition process. Silicon layer 32 may have a thickness greater than about 10 Å, so that it may act as an effective nitrogen blocking layer in subsequent processes. The thickness of silicon layer 32 may be in the range between about 10 Å and about 20 Å.

When epitaxy layer 20-2 is formed in preceding steps, silicon layer 32 is formed. In the region in which epitaxy layer 20-2 is not formed and an entirety of semiconductor strip 30 is formed of silicon, silicon layer 32 may or may not be formed (since semiconductor strip 30 itself is formed of silicon). In FIG. 3, silicon layer 32 is shown with dashed lines to indicate it may or may not be formed in accordance with various embodiments.

Oxygen-containing dielectric layer (which may be an oxide layer) 34 is then deposited on silicon layer 32. The respective process is illustrated as process 206 in the process flow shown in FIG. 18. In accordance with some embodiments of the present disclosure, oxygen-containing dielectric layer 34 is formed of silicon oxide ($SiO_2$). In accordance with other embodiments of the present disclosure, oxygen-containing dielectric layer 34 is formed of silicon oxy-carbide (SiOC), silicon oxy-nitride (SiON), silicon oxy-carbon-nitride (SiOCN), or the like. The formation method may include a conformal deposition method such as Atomic Layer Deposition (ALD), CVD, or the like. The thickness of oxygen-containing dielectric layer 34 is selected to be thin enough so that nitrogen atoms can penetrate through it in the subsequent anneal process, while still thick enough to function as a barrier of nitrogen atoms, so that nitrogen atoms may accumulate between oxygen-containing dielectric layer 34 and silicon layer 32 in subsequent processes. In accordance with some embodiments of the present disclosure, the thickness of oxygen-containing dielectric layer 34 is in the range between about 15 Å and about 50 Å. When the thickness of oxygen-containing dielectric layer 34 is out of this range, oxygen-containing dielectric layer 34 either does not allow the penetration of nitrogen atoms, or is not able to keep nitrogen atoms to accumulate between layers 32 and 34 to an intended thickness.

Figure 4:
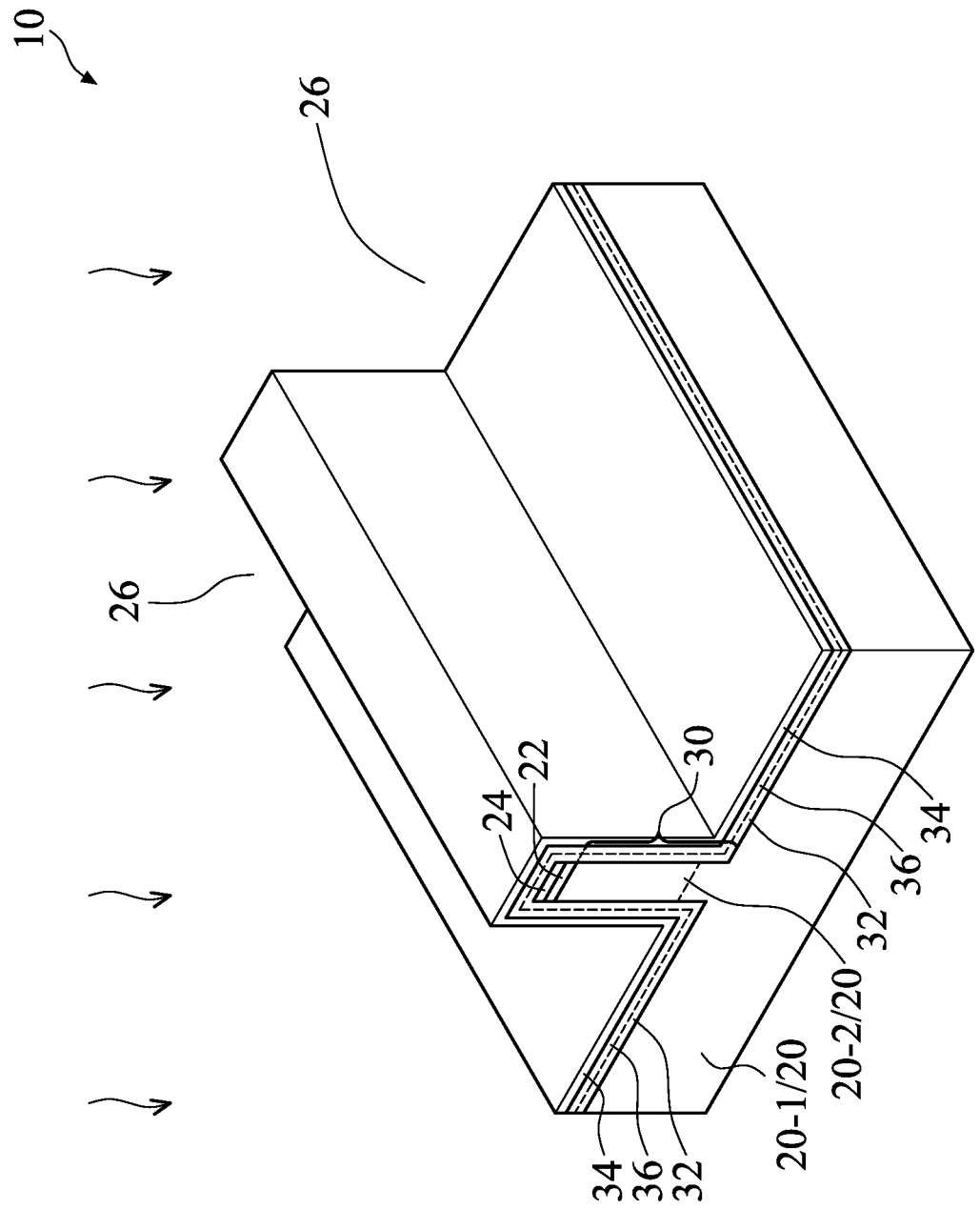

FIG. 4 illustrates the formation of (first) dielectric barrier layer 36 between oxygen-containing dielectric layer 34 and silicon layer 32. In accordance with some embodiments of the present disclosure, the formation is achieved by thermally treating wafer 10 in an environment containing ammonia ($NH_3$). In accordance with some embodiments of the present disclosure, the formation is achieved by thermally treating wafer 10 in an environment containing $N_2$, $N_2H_2$, or the like. The environment may be a process chamber. The respective process is illustrated as process 208 in the process flow shown in FIG. 18. In accordance with some embodiments of the present disclosure, the pressure of $NH_3$ is in the range between about 0.5 torr and about 10 torr. The temperature of the thermal treatment may be in the range between about 500° C. and about 700° C., and the treatment time may be in the range between about 20 minutes and about 40 minutes. In accordance with other embodiments of the present disclosure, the temperature of the thermal treatment is in the range between about 900° C. and about 1,100° C., and the treatment time may be in the range between about 1 millisecond and about 5 milliseconds. During the thermal treatment, no plasma is generated, and hence the thermal treatment is performed in a plasma-free environment.

As a result of the treatment in the $NH_3$-containing environment, nitrogen atoms in $NH_3$ penetrate through oxygen-containing dielectric layer 34. The oxygen in oxygen-containing dielectric layer 34 makes oxygen-containing dielectric layer 34 permeable for nitrogen atoms to penetrate through. After the nitrogen atoms in $NH_3$ penetrate through oxygen-containing dielectric layer 34, the penetrated nitrogen atoms are blocked by silicon layer 32, which is an effective blocking layer for nitrogen. Nitrogen atoms are thus accumulated between oxygen-containing dielectric layer 34 and silicon layer 32 to form dielectric barrier layer 36. In accordance with some embodiments of the present disclosure, silicon-and-nitrogen-containing dielectric barrier layer 36 comprises silicon, nitride, and possibly carbon and oxygen. Dielectric barrier layer 36 may be formed as a conformal layer or a substantially conformal layer where oxygen-containing dielectric layer 34 contacts silicon layer 32 both exist. The nitrogen atomic percentage in dielectric barrier layer 36 may be greater than about 30 percent, and may be in the range between about 40 percent and about 70 percent. Dielectric barrier layer 36 may include a small amount of hydrogen, oxygen, and carbon (for example, less than about 20 atomic percent in combination) therein. Dielectric barrier layer may have a middle portion with a peak nitrogen atomic percentage, and opposite side portions on the opposite sides of the middle portion, with the opposite portions having gradually reduced nitrogen atomic percentages than the middle portion. Accordingly, in a direction pointing from the middle portion toward silicon layer 32, the atomic percentages of nitrogen and oxygen gradually reduces, and the atomic percentage of silicon gradually increases, in dielectric barrier layer 36. In a direction pointing from the middle portion (the peak of nitrogen) toward oxygen-containing dielectric layer 34, the atomic percentage of oxygen gradually increases, and the atomic percentage of silicon and nitrogen gradually reduce, in dielectric barrier layer 36. In accordance with some embodiments, the carbon percentages in layers 32, 34, and 36 are close to each other.

It is appreciated that the thickness of dielectric barrier layer 36 is affected by various factors such as the composition and the thickness of oxygen-containing dielectric layer 34. For example, a thicker oxygen-containing dielectric layer 34 may result in a thicker dielectric barrier layer 36. However, a thicker dielectric barrier layer 36 is formed by longer treatment time and/or higher treatment temperature. In accordance with some embodiments of the present disclosure, the thickness of dielectric barrier layer 36 is in the range between about 1 Å and about 10 Å. Accordingly, to allow the thickness of dielectric barrier layer 36 to fall into the desirable range, an appropriate thickness of oxygen-containing dielectric layer 34 is adopted. Furthermore, experiments may be performed on sample wafers using different combinations of process conditions/factors (such as the thickness of layer 34, the anneal time and anneal temperature, etc.) to find a set of process factors (and conditions), so that the thickness of the resulting dielectric barrier layer 36 may fall into the desirable (target) range. The desirable thickness of dielectric barrier layer 36 and its effect are also discussed in subsequent paragraphs. The thickness of dielectric barrier layer 36 may be smaller than both the thickness of silicon layer 32 and the thickness of oxygen-containing dielectric layer 34. Also, the thickness of silicon layer 32 may be smaller than the thickness of oxygen-containing dielectric layer 34.

In the initial stage of the treatment, more nitrogen atoms are diffused toward silicon layer 32 from the $NH_3$-containing environment. After the nitrogen atoms are accumulated, more and more nitrogen atoms are diffused back toward the $NH_3$-containing environment from the accumulated dielectric barrier layer 36. When the treatment is long enough, equilibrium is established, and the thickness of dielectric barrier layer 36 is maintained substantially unchanged even if the anneal is prolonged.

Figure 5:
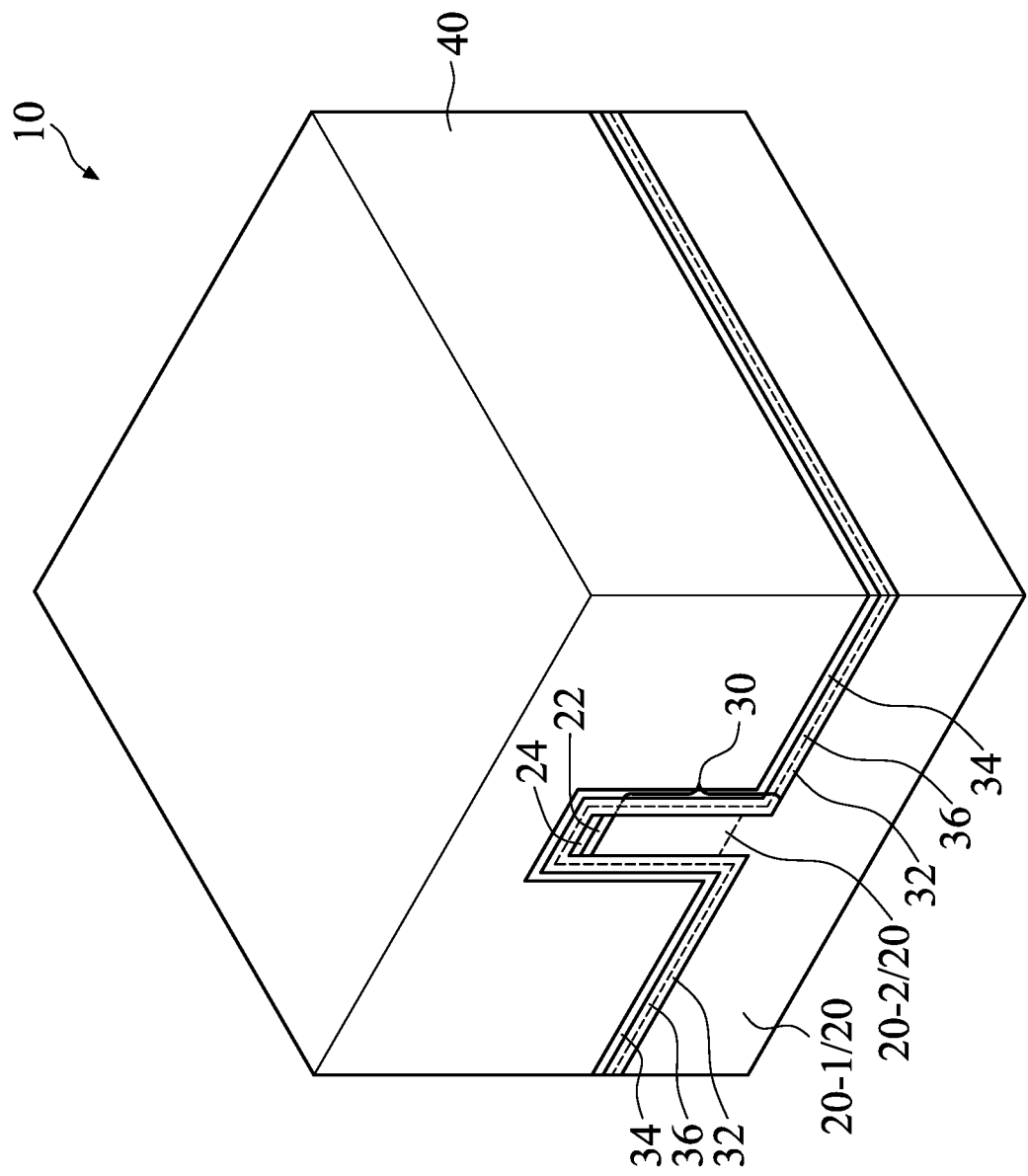

Dielectric material 40 is then formed to fill the remaining portions of trenches 26, and then planarized, resulting in the structure shown in FIG. 5. The respective process is illustrated as process 210 in the process flow shown in FIG. 18. The formation method of dielectric material 40 may be selected from Flowable Chemical Vapor Deposition (FCVD), spin-on coating, CVD, ALD, High-Density Plasma Chemical Vapor Deposition (HDPCVD), Low Pressure CVD (LPCVD), and the like.

In accordance with some embodiments in which FCVD is used, a silicon- and nitrogen-containing precursor (for example, trisilylamine (TSA) or disilylamine (DSA)) is used, and hence the resulting dielectric material 40 is flowable. In accordance with alternative embodiments of the present disclosure, the flowable dielectric material 40 is formed using an alkylamino silane based precursor. During the deposition, plasma is turned on to activate the gaseous precursors for forming the flowable oxide. After dielectric material 40 is formed, an anneal/curing process is performed, which converts flowable dielectric material 40 into a solid dielectric material. The solidified dielectric material is also referred to as dielectric material 40.

In accordance with some exemplary embodiments of the present disclosure, the anneal is performed in an oxygen-containing environment. The annealing temperature may be higher than about 200° C., for example, in a temperature range between about 200° C. and about 700° C. During the thermal treatment, an oxygen-containing process gas is conducted into the process chamber in which wafer 10 is placed. The oxygen-containing process gas may include oxygen ($O_2$), ozone ($O_3$), or combinations thereof. Steam ($H_2O$) may also be used. As a result of the thermal treatment, dielectric material 40 is cured and solidified. The resulting dielectric material 40 may be an oxide. A planarization process such as a Chemical Mechanical Polish (CMP) process or a mechanical grinding process may be performed to level the top surface of dielectric material 40. In the planarization process, hard mask 24 may be used as a stop layer.

In the curing of dielectric material 40, oxygen may migrate from dielectric material 40 to semiconductor strip 30, causing the outer portions of semiconductor strip 30 to be oxidized. This results in the undesirable thinning of semiconductor strip 30. In accordance with some embodiments of the present disclosure, dielectric barrier layer 36 is formed as a blocking layer of oxygen, which prevents oxygen from reaching semiconductor strip 30. A thicker dielectric barrier layer 36 is more effective in blocking oxygen. On the other hand, a thicker dielectric barrier layer 36 attracts more charges in semiconductor strip 30 and the underlying portion of substrate 20, thus results in more charges to be accumulated in silicon layer 32 and its adjacent portions of substrate 20 and semiconductor strip 30. The charge-accumulated layer forms a channel for leakage current. Accordingly, dielectric barrier layer 36 cannot be too thick. To balance the effect of blocking oxygen without resulting in the adverse increase in leakage current, the thickness of dielectric barrier layer 36 may be selected to be in the range between about 1 Å and about 10 Å.

In accordance with some embodiments of the present disclosure, the combination of oxygen-containing dielectric layer 34 and dielectric barrier layer 36 show good results in both the reduction of leakage and oxidation prevention (due to dielectric barrier layer 36). The good results are due to the existence of oxygen-containing dielectric layer 34 that does not attract charges, and further due to the limited thickness of dielectric barrier layer 36.

Figure 6:
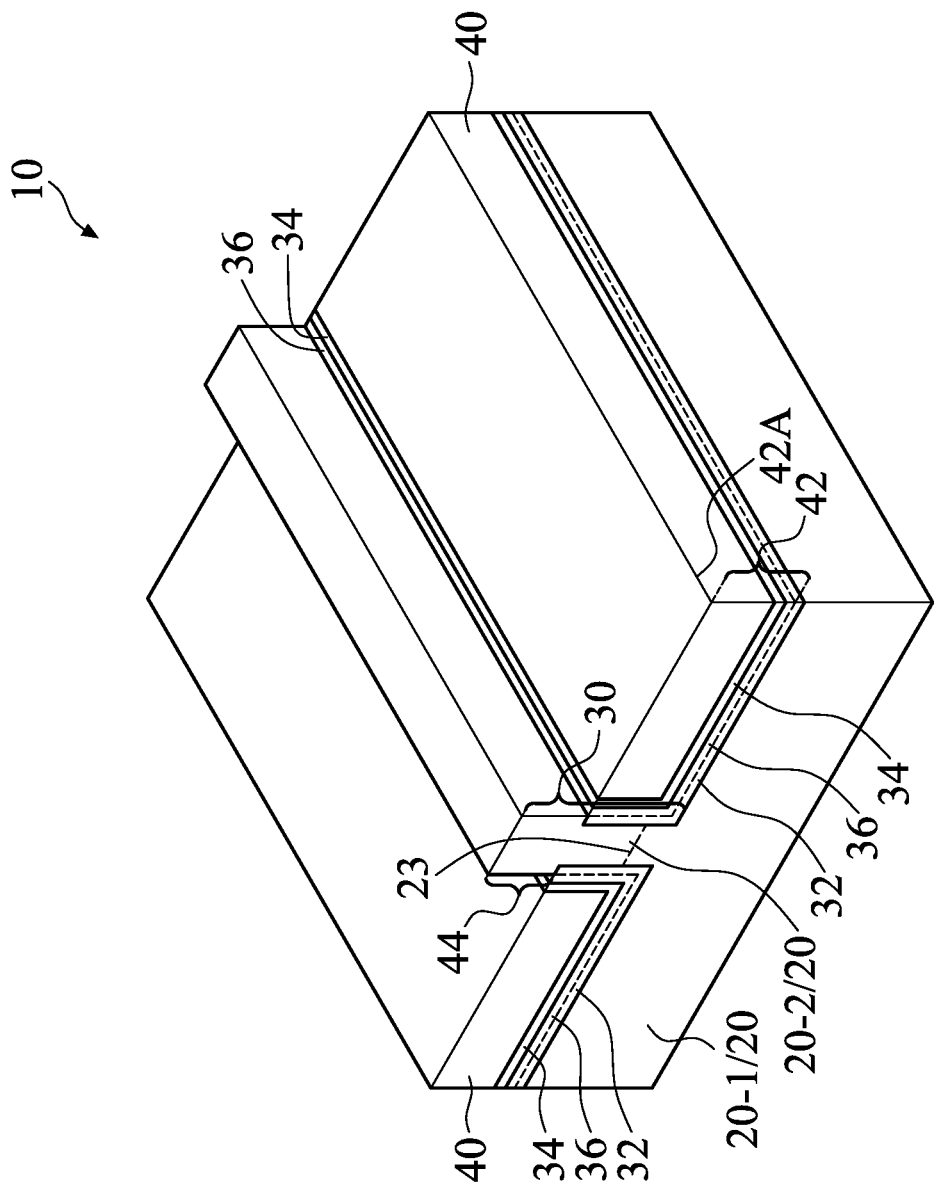

Next, as shown in FIG. 6, the dielectric regions including silicon layer 32, dielectric barrier layer 36, and oxygen-containing dielectric layer 34 are recessed, and the resulting dielectric regions are referred to as dielectric regions 42. The respective process is illustrated as process 212 in the process flow shown in FIG. 18. Throughout the description, dielectric regions 42 are alternatively referred to as isolation regions 42 or Shallow Trench Isolation (STI) regions 42. The portion of semiconductor strip 30 (and the portion of silicon layer 32) higher than STI regions 42 are referred to as protruding (semiconductor) fin 44. In accordance with some embodiments of the present disclosure, the top surfaces of STI regions 42 are higher than the bottom surface 23 of epitaxy layer 20-2 (if formed). The recessing of the dielectric regions may be performed using a dry etch process, in which $HF_3$ and $NH_3$ are used as the etching gases. In accordance with alternative embodiments of the present disclosure, the recessing of the dielectric regions is performed using a wet etch process. The etching chemical may include HF solution, for example.

In above-illustrated embodiments, semiconductor fins may be formed by any suitable method. For example, the semiconductor fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 7:
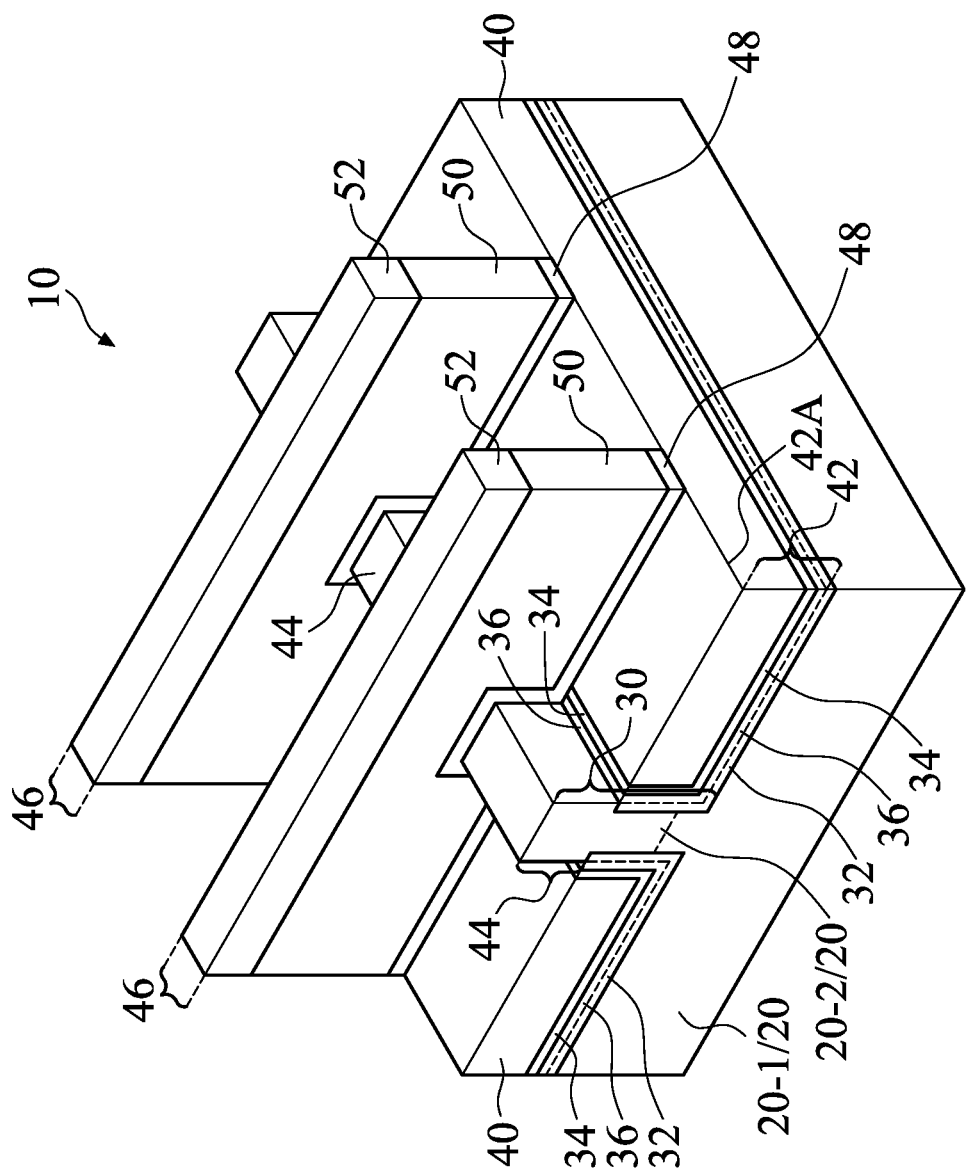

Referring to FIG. 7, dummy gate stacks 46 are formed to cross protruding fin 44. The respective process is illustrated as process 214 in the process flow shown in FIG. 18. Dummy gate stacks 46 may include dummy gate dielectrics 48 and dummy gate electrodes 50 over dummy gate dielectrics 48. Dummy gate dielectrics 48 may be formed of silicon oxide or other dielectric materials. Dummy gate electrodes 50 may be formed, for example, using polysilicon or amorphous silicon, and other materials may also be used. Each of dummy gate stacks 46 may also include one (or a plurality of) hard mask layer 52 over dummy gate electrode 50. Hard mask layers 52 may be formed of silicon nitride, silicon oxide, silicon carbo-nitride, or multi-layers thereof. Dummy gate stacks 46 may cross over a single one or a plurality of protruding fin 44 and/or STI regions 42. Dummy gate stacks 46 also have lengthwise directions perpendicular to the lengthwise directions of protruding fin 44. The formation of dummy gate stacks 46 includes depositing a dummy gate dielectric layer, depositing a gate electrode layer over the dummy gate dielectric layer, depositing a hard mask layer, and patterning the stack layers to form dummy gate stacks 46.

Figure 8:
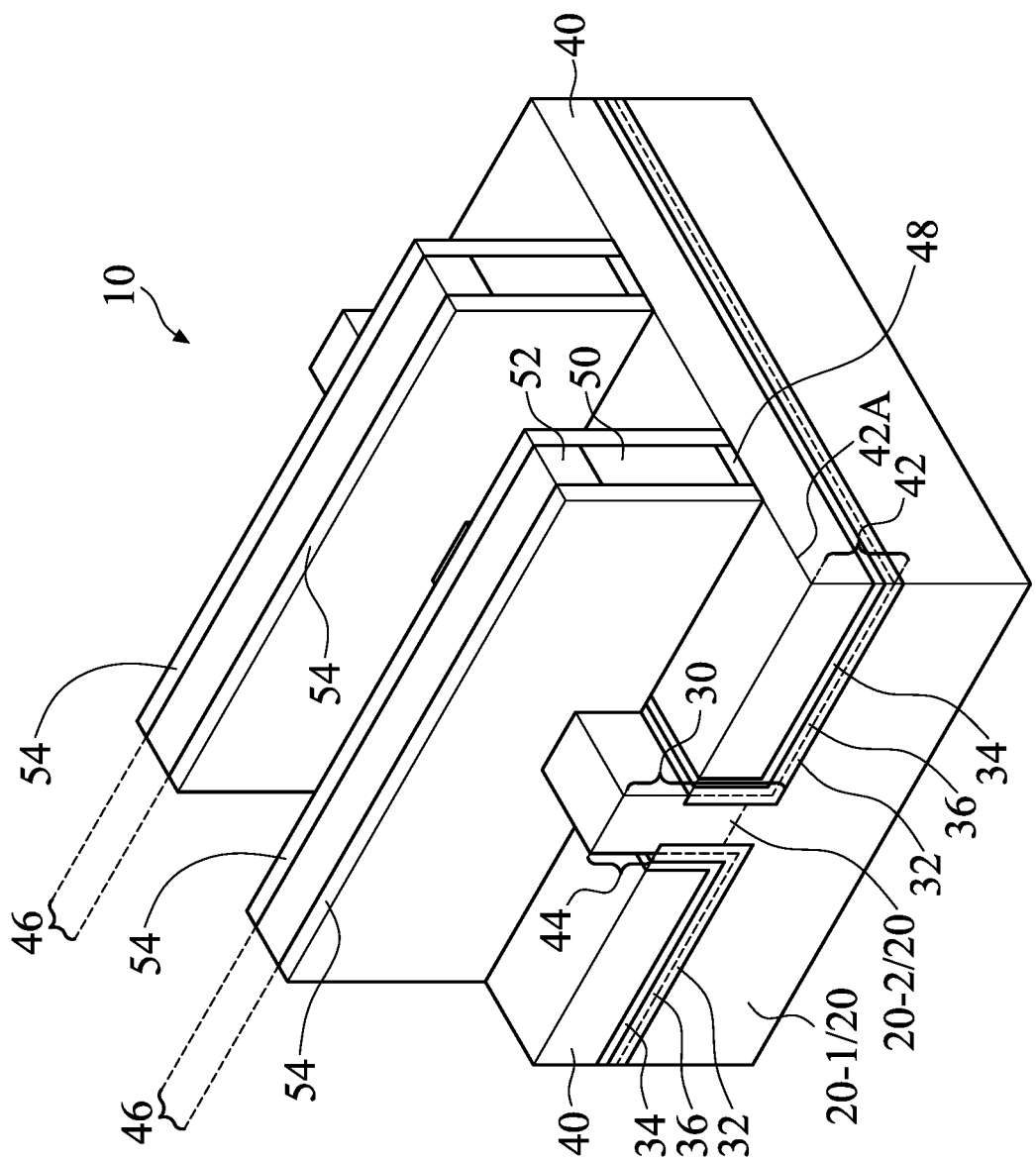

Next, referring to FIG. 8, gate spacers 54 are formed on the sidewalls of dummy gate stacks 46. The respective process is illustrated as process 216 in the process flow shown in FIG. 18. The formation of gate spacers 54 may include depositing a blanket dielectric layer, and performing an anisotropic etch to remove the horizontal portions of the dielectric layer, leaving gate spacers 54 to be on the sidewalls of dummy gate stacks 46. In accordance with some embodiments of the present disclosure, gate spacers 54 are formed of an oxygen-containing dielectric material (an oxide) such as $SiO_2$, SiOC, SiOCN, or the like. In accordance with some embodiments of the present disclosure, gate spacers 54 may also include a non-oxide dielectric material such as silicon nitride.

Figure 9:
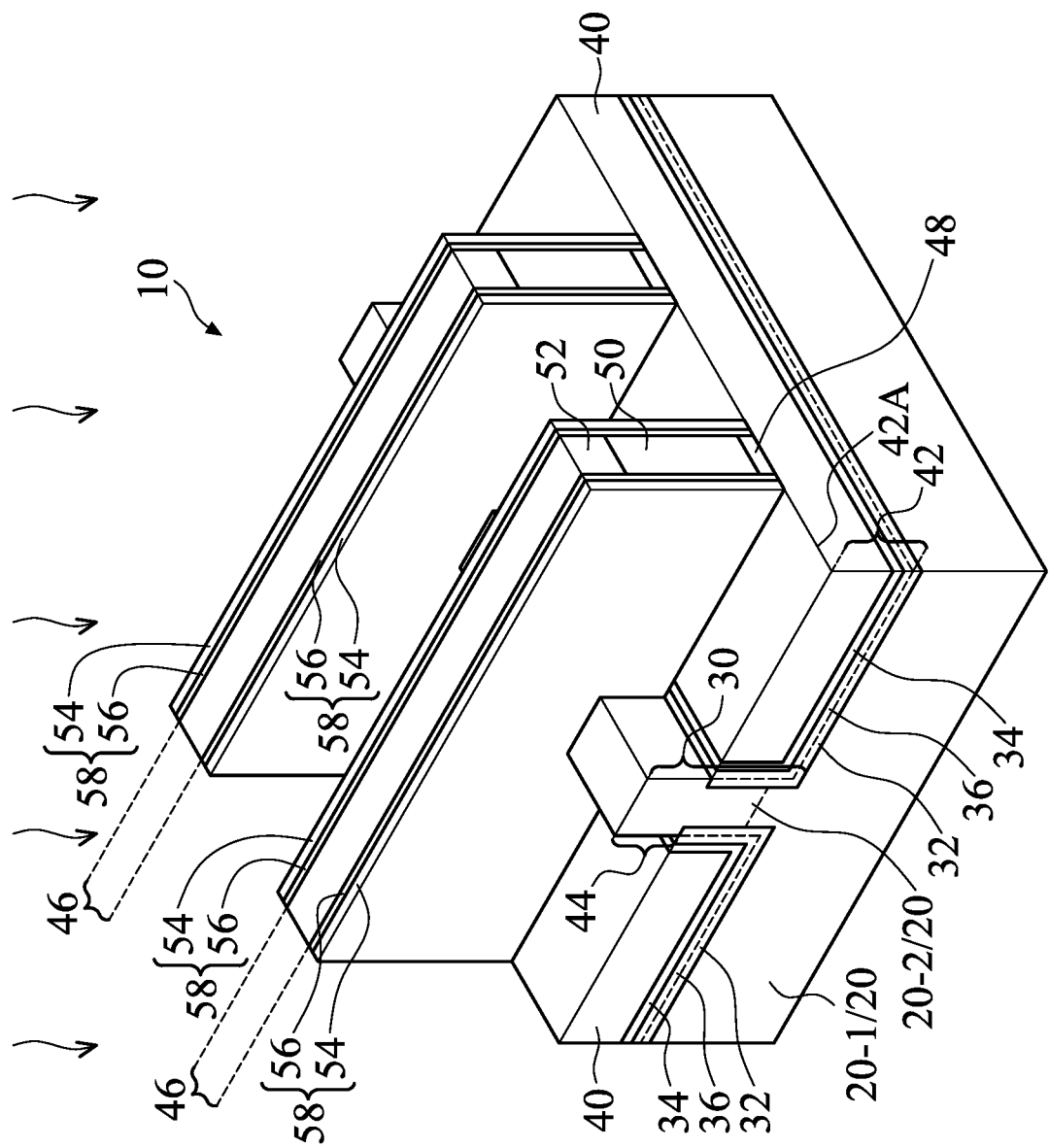

Referring to FIG. 9, a thermal treatment is performed to form silicon-and-nitrogen-containing layer 56. The respective process is illustrated as process 218 in the process flow shown in FIG. 18. The treatment is similar to the treatment process for forming dielectric barrier layer 36. The process details may be essentially the same as the process details for forming dielectric barrier layer 36, and hence are not repeated herein. The details (such as the composition, the thickness, etc.) of the resulting silicon-and-nitrogen-containing layer 56 may be similar to that of silicon nitride layers 36. Throughout the description, silicon-and-nitrogen-containing layer 56 is alternatively referred to as silicon nitride layer 56 although it may include other elements such as carbon, oxygen, or the like. In accordance with some embodiments in which dummy gate electrodes 50 are formed of polysilicon or amorphous silicon, dummy gate electrodes 50 act as the blocking layer for blocking nitrogen atoms, and hence no additional silicon layer is formed for the purpose of blocking nitrogen atoms. In accordance with alternative embodiments in which gate electrodes 50 are formed of a non-silicon material (such as amorphous carbon), an additional silicon layer (not shown) is formed on the sidewalls of dummy gate stacks 46 before the formation of gate spacers 54. Accordingly, silicon nitride layer 56 will be formed between the additional silicon layer and gate spacer 54. In subsequent paragraphs, silicon nitride layers 56 and gate spacers 54 are in combination referred to as gate spacers 58.

In accordance with alternative embodiments of the present disclosure, the thermal treatment for forming silicon nitride layer 56 is skipped, and hence silicon nitride layer 56 is not formed.

Figure 10:
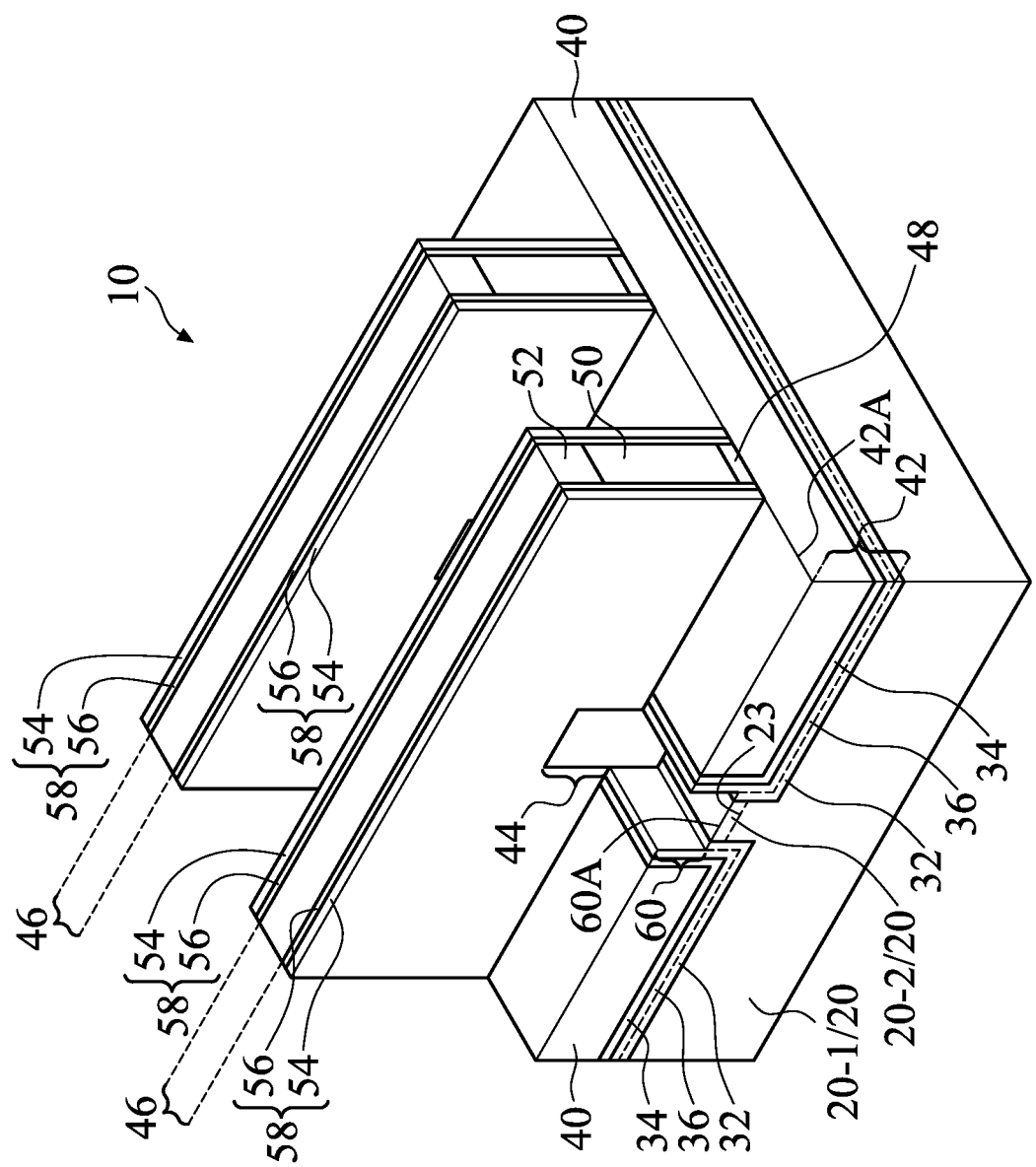

In a subsequent step, an etching process (referred to as fin recessing hereinafter) is performed to etch the portions of protruding fin 44 that are not covered by dummy gate stacks 46 and gate spacers 58, resulting in the structure shown in FIG. 10. The respective process is illustrated as process 220 in the process flow shown in FIG. 18. The recessing of protruding fin 44 may be performed through an anisotropic etching process, and hence the portions of protruding fin 44 directly underlying dummy gate stacks 46 and gate spacers 58 are protected, and are not etched. The top surfaces of the recessed semiconductor strip 30 may be lower than the top surfaces 42A of STI regions 42 in accordance with some embodiments. Recesses 60 are accordingly formed between STI regions 42. Recesses 60 are located on the opposite sides of dummy gate stacks 46. In the recessing, the portions of silicon layer 32 higher than the bottom surfaces 60A of recesses 60 are also etched, hence the sidewalls of silicon nitride layers 36 are exposed. The bottom surfaces 60A may also be higher than, level with, or lower than, the interface 23. Accordingly, there may be, or may not be, remaining portions of epitaxy semiconductor layer 20-2 directly underlying recesses 60.

Figure 11:
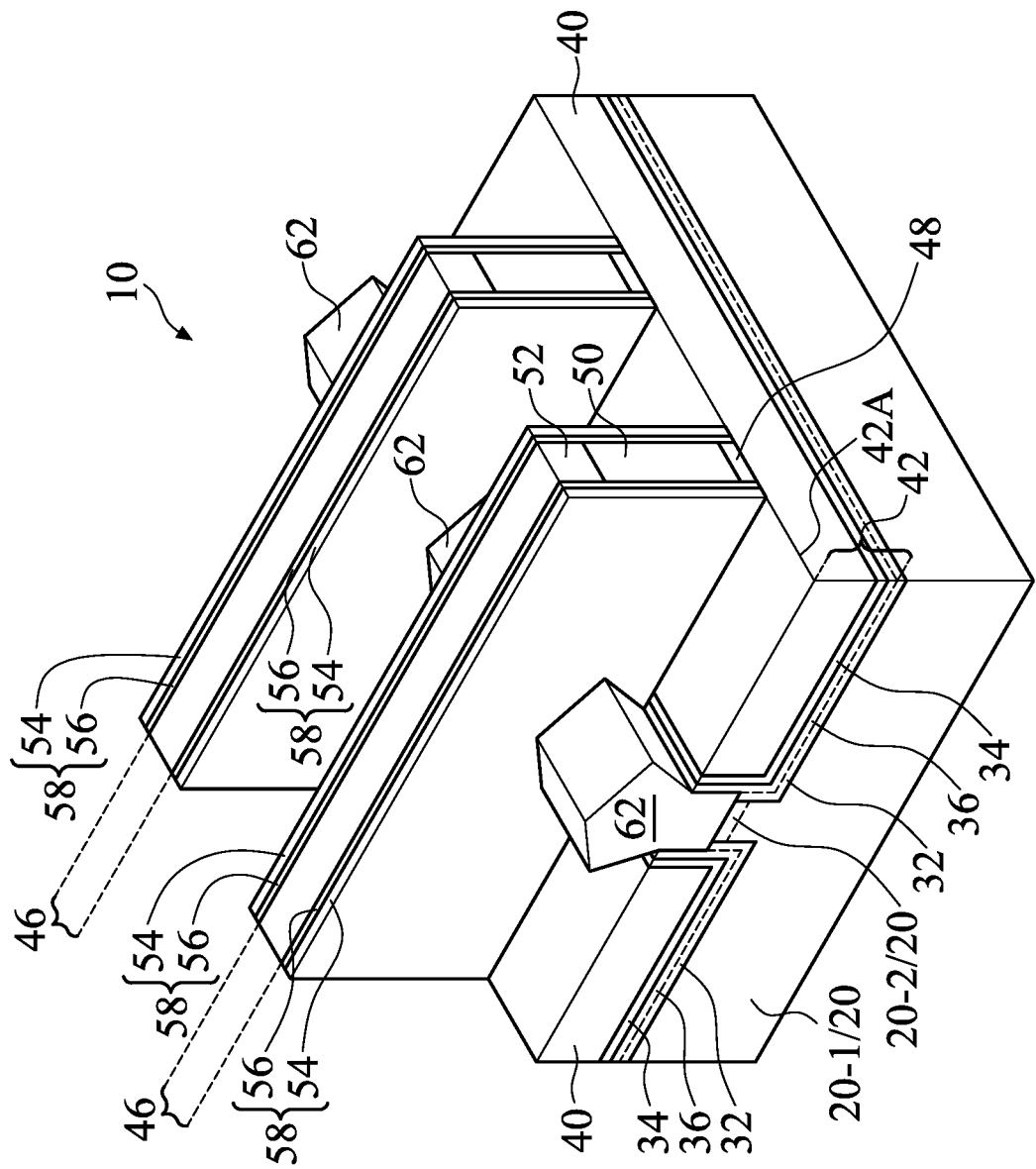

Next, epitaxy regions (source/drain regions) 62 are formed by selectively growing a semiconductor material from recesses 60, resulting in the structure in FIG. 11. The respective process is illustrated as process 222 in the process flow shown in FIG. 18. In accordance with some embodiments of the present disclosure, epitaxy regions 62 include silicon germanium, silicon, or silicon carbon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 62 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 62 fully fill recesses 60, epitaxy regions 62 start expanding horizontally, and facets may be formed.

After the epitaxy step, epitaxy regions 62 may be further implanted with a p-type or an n-type impurity to form source and drain regions, which are also denoted using reference numeral 62. In accordance with alternative embodiments of the present disclosure, the implantation process is skipped when epitaxy regions 62 are in-situ doped with the p-type or n-type impurity during the epitaxy.

In accordance with alternative embodiments of the present disclosure, instead of recessing protruding fin 44 and re-growing source/drain regions 62, cladding source/drain regions are formed. In accordance with these embodiments, the protruding fin 44 as shown in FIG. 9 is not recessed, and epitaxy regions (not shown) are grown on protruding fin 44. The material of the grown epitaxy regions may be similar to the material of the epitaxy semiconductor material 62 as shown in FIG. 11, depending on whether the resulting FinFET is a p-type or an n-type FinFET. Accordingly, source/drain regions 62 include protruding fin 44 and the epitaxy regions. An implantation may (or may not) be performed to implant an n-type impurity or a p-type impurity.

Figure 12:
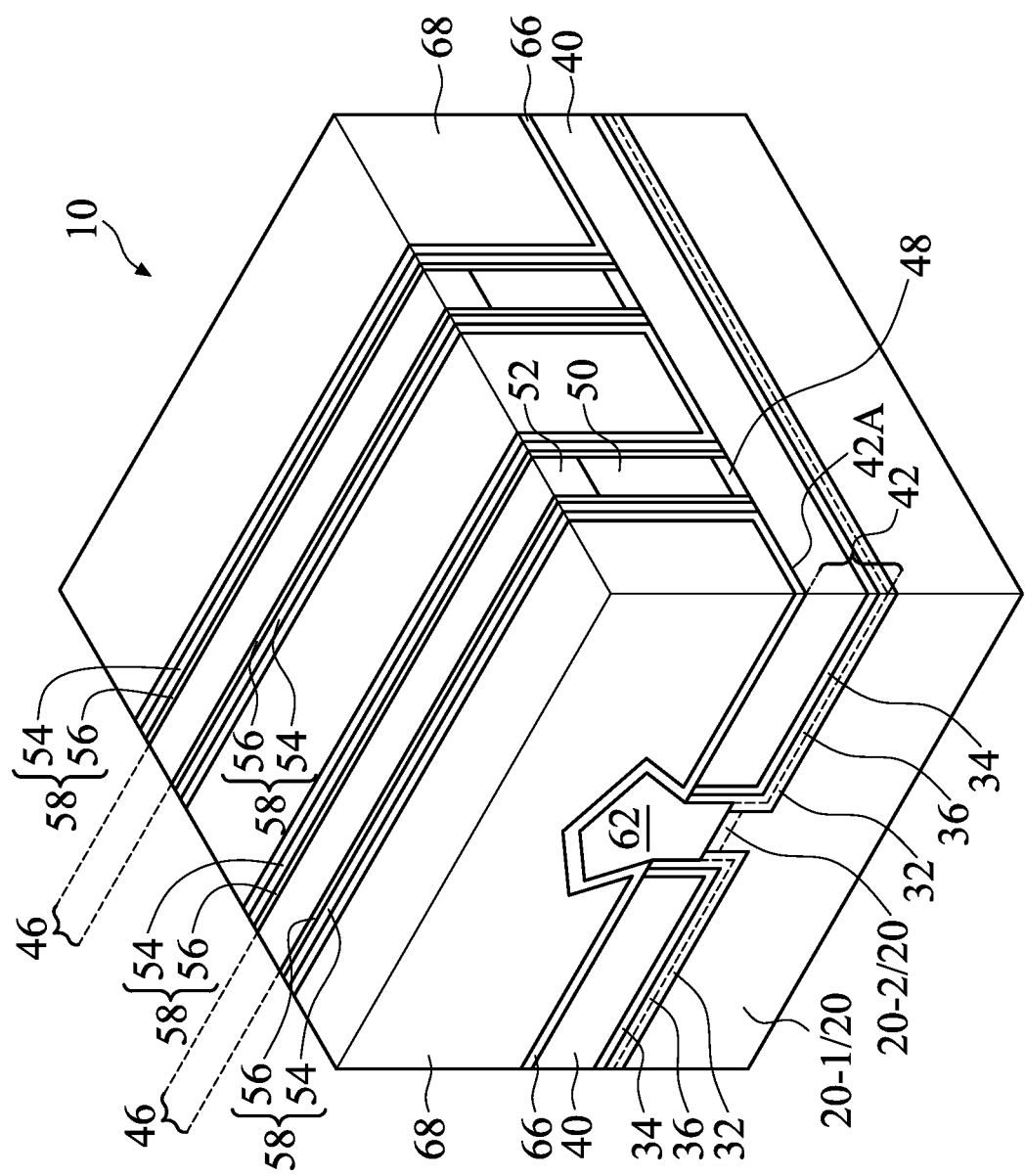

FIG. 12 illustrates a perspective view of the structure after the formation of Contact Etch Stop Layer (CESL) 66 and Inter-Layer Dielectric (ILD) 68. The respective process is illustrated as process 224 in the process flow shown in FIG. 18. CESL 66 may be formed of silicon nitride, silicon carbo-nitride, or the like. CESL 66 may be formed using a conformal deposition method such as ALD or CVD, for example. ILD 68 may include a dielectric material formed using, for example, FCVD, spin-on coating, CVD, or other deposition methods. ILD 68 may also be formed of an oxygen-containing dielectric material, which may be a silicon-oxide based material such as a Tetra Ethyl Ortho Silicate (TEOS) oxide, a Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process is performed to level the top surfaces of ILD 68, dummy gate stacks 46, and gate spacers 58 with each other. In the formation of ILD 68, an anneal process may be adopted. In accordance with some embodiments of the present disclosure, silicon nitride layer 56 acts as the blocking layer to block oxygen from penetrating through and reaching protruding fin 44 (not visible in FIG. 12, refer to FIGS. 6 and 7).

Figure 13:
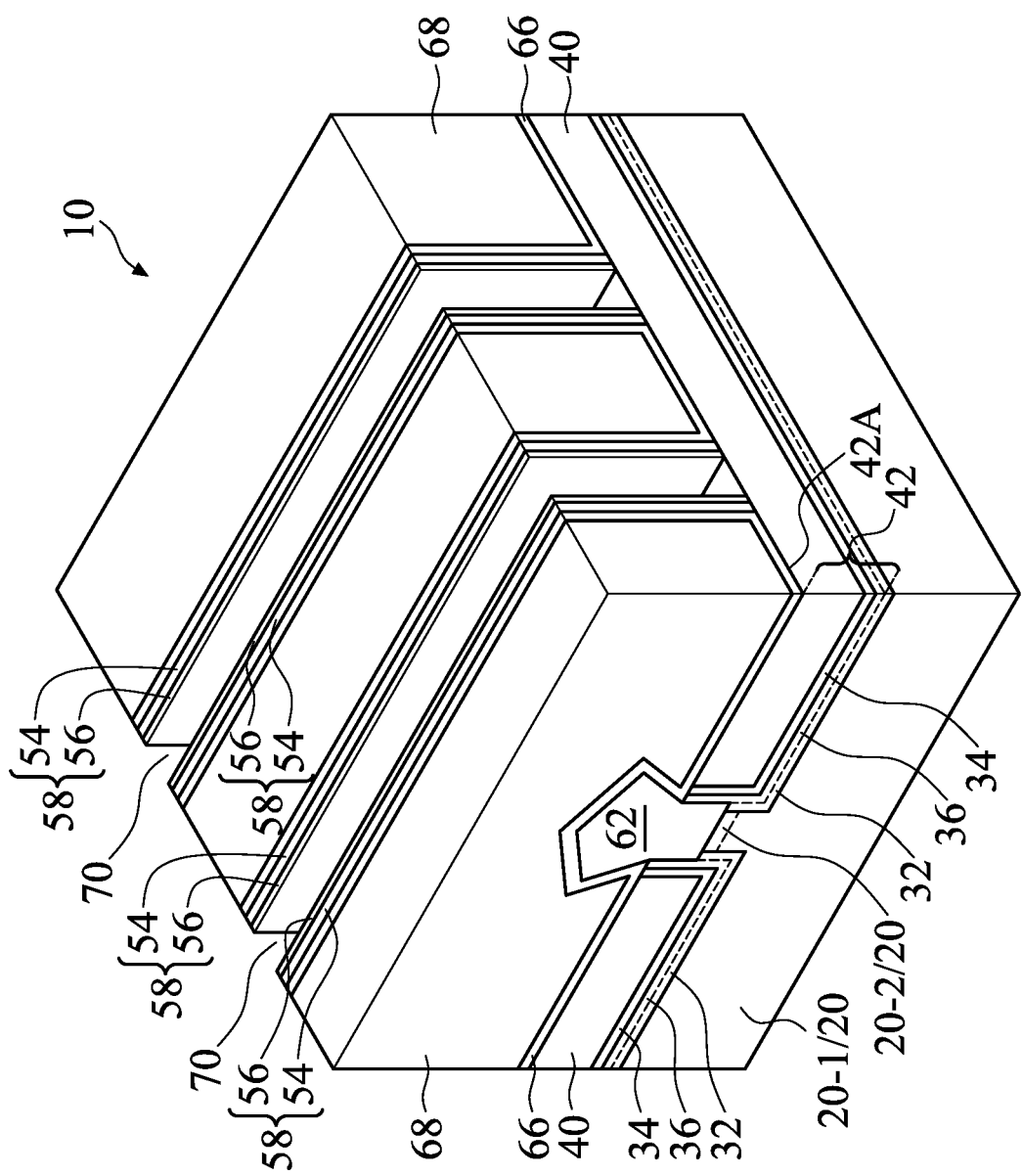

Next, dummy gate stacks 46, which include hard mask layers 52, dummy gate electrodes 50 and dummy gate dielectrics 48, are etched in one or a plurality of etching processes, resulting in trenches 70 to be formed between opposite portions of gate spacers 58, as shown in FIG. 13. The respective process is illustrated as process 226 in the process flow shown in FIG. 18. The etching process may be performed using, for example, dry etching. Plasma may also be turned on in the etching process. The etching gases are selected based on the material to be etched. For example, when hard masks 36 include silicon nitride, the etching gas may include fluorine-containing process gases such as $CF_4/O_2/N_2$, $NF_3/O_2$, $SF_6$, or $SF_6/O_2$, or the like. Dummy gate electrodes 50 may be etched using $C_2F_6$, $CF_4$, $SO_2$, the mixture of HBr, $Cl_2$, and $O_2$, or the mixture of HBr, $Cl_2$, $O_2$, and $CF_2$ etc. Dummy gate dielectrics 48 may be etched using the mixture of $NF_3$ and $NH_3$ or the mixture of HF and $NH_3$. If silicon layers are formed on the sidewalls of dummy gate stacks 46, the silicon layers are also removed.

As a result of the etching of dummy gate stacks 46, silicon nitride layers 56 are exposed to trenches 70. In the etching process, silicon nitride layers 56 may be thinned, for example, to a thickness in the range between about 1 Å and about 5 Å. In accordance with some embodiment in which the original silicon nitride layers 56 are very thin before the removal of dummy gate stacks 46, silicon nitride layers 56 may also be removed as a result of the etching, and hence the sidewalls of gate spacers 54 are exposed to trenches 70. Silicon nitride layers 56, with a high nitrogen percentage, are more resistant to the damage caused by the plasma used in the etching of dummy gate stacks 46.

Figure 14:
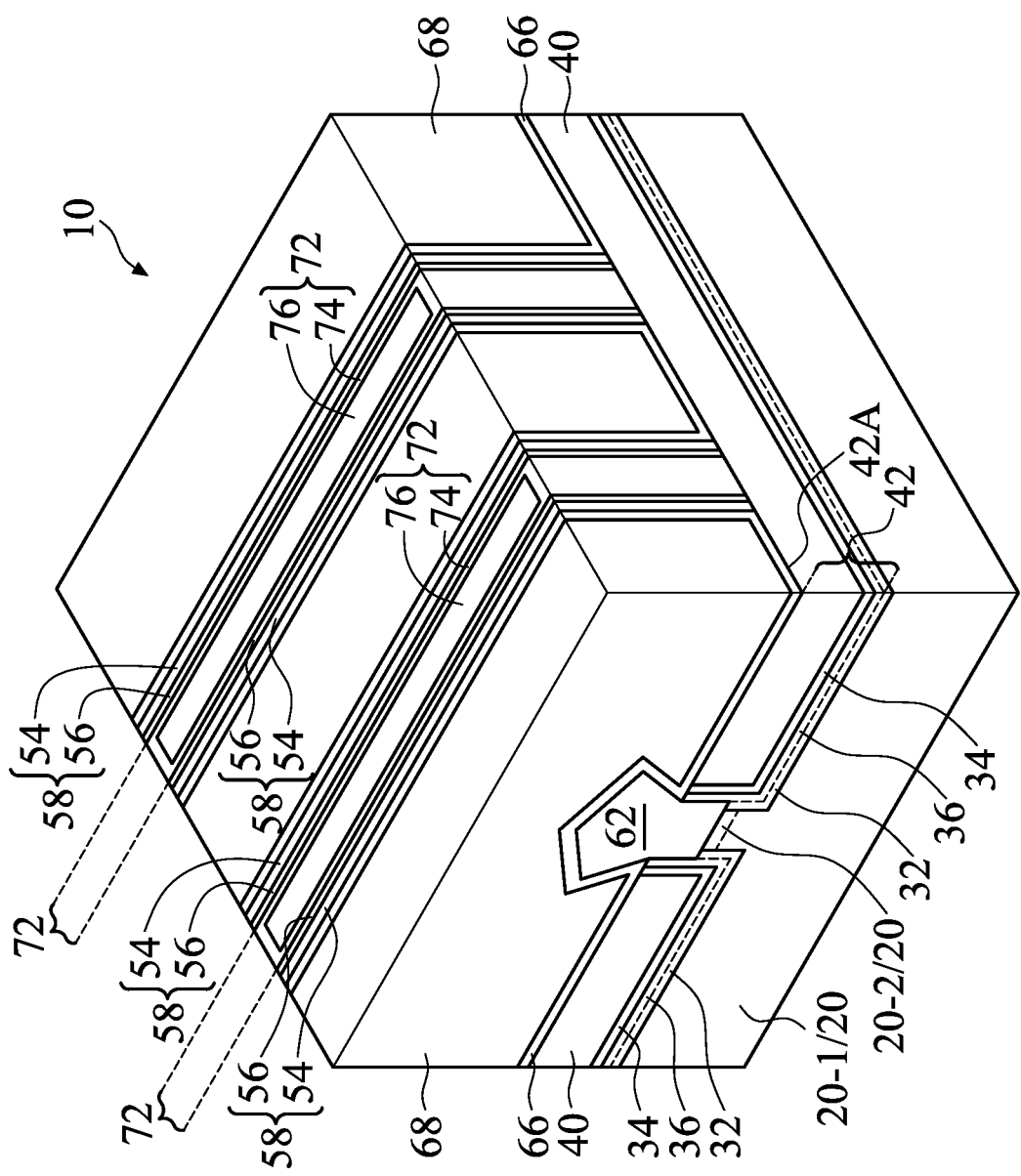

Next, referring to FIG. 14, (replacement) gate stacks 72 are formed, which include gate dielectrics 74 and gate electrodes 76. The respective process is illustrated as process 228 in the process flow shown in FIG. 18. The formation of gate stacks 72 includes forming/depositing a plurality of layers, and then performing a planarization process such as a CMP process or a mechanical grinding process. Gate dielectrics 74 extend into the trenches 70 (FIG. 13). In accordance with some embodiments of the present disclosure, gate dielectrics 74 include Interfacial Layers (ILs) 78 (FIGS. 17A and 17B) as their lower parts. ILs 78 are formed on the exposed surfaces of protruding fin 44. ILs 78 may include an oxide layer such as a silicon oxide layer, which is formed through the thermal oxidation of protruding fin 44, a chemical oxidation process, or a deposition process. Gate dielectrics 74 may also include high-k dielectric layers 80 (FIG. 9B) formed over ILs 78. High-k dielectric layers 80 may include a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is higher than 3.9, and may be higher than about 7.0. High-k dielectric layers 80 are formed as conformal layers, and extend on the sidewalls of protruding fin 44 and the sidewalls of gate spacers 58. In accordance with some embodiments of the present disclosure, high-k dielectric layers 80 are formed using ALD or CVD.

Referring again to FIG. 14, gate electrodes 76 are formed on top of gate dielectrics 74, and fill the remaining portions of the trenches left by the removed dummy gate stacks. The sub-layers in gate electrodes 76 are not shown separately in FIG. 14, while in reality, the sub-layers are distinguishable from each other due to the difference in their compositions. The deposition of at least lower sub-layers may be performed using conformal deposition methods such as ALD or CVD, so that the thickness of the vertical portions and the thickness of the horizontal portions of gate electrodes 76 (of each of sub-layers) are substantially equal to each other Gate electrodes 76 may include a plurality of layers including, and not limited to, a Titanium Silicon Nitride (TSN) layer, a tantalum nitride (TaN) layer, a titanium nitride (TiN) layer, a titanium aluminum (TiAl) layer, an additional TiN and/or TaN layer, and a filling metal. Some of these layers define the work function of the respective FinFET. Furthermore, the metal layers of a p-type FinFET and the metal layers of an n-type FinFET may be different from each other so that the work functions of the metal layers are suitable for the respective p-type or n-type FinFETs. The filling metal may include aluminum, copper, or cobalt.

Figure 15:
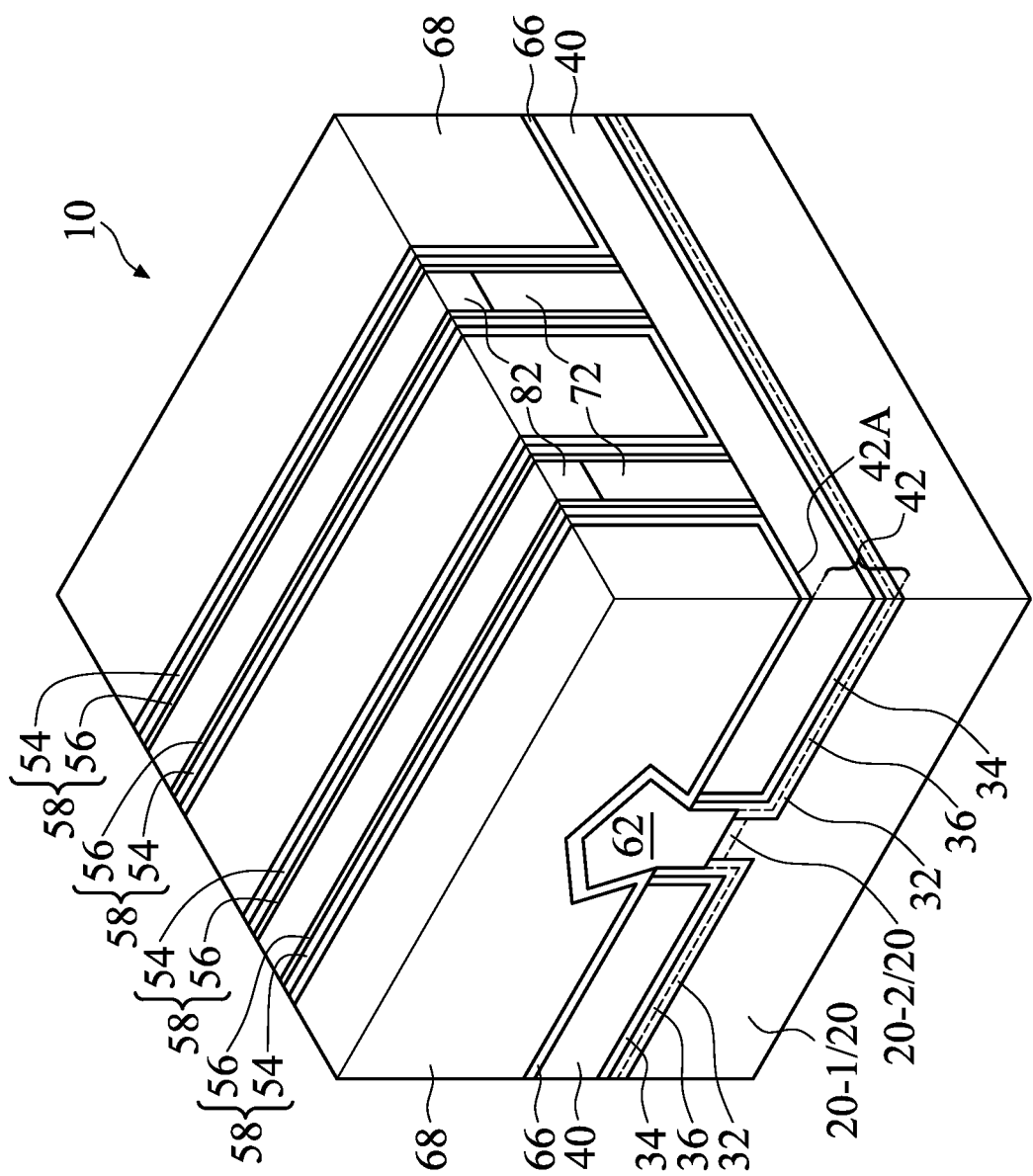

Next, as shown in FIG. 15, hard masks 82 are formed. In accordance with some embodiments of the present disclosure, the formation of hard masks 82 includes recessing replacement gate stacks 72 through etching to form recesses, filling a dielectric material into the recesses, and performing a planarization to remove the excess portions of the dielectric material. The remaining portions of the dielectric material are hard masks 82. In accordance with some embodiments of the present disclosure, hard masks 82 are formed of silicon nitride, silicon oxynitride, silicon oxy-carbide, silicon oxy-carbo-nitride, or the like.

Figure 16:
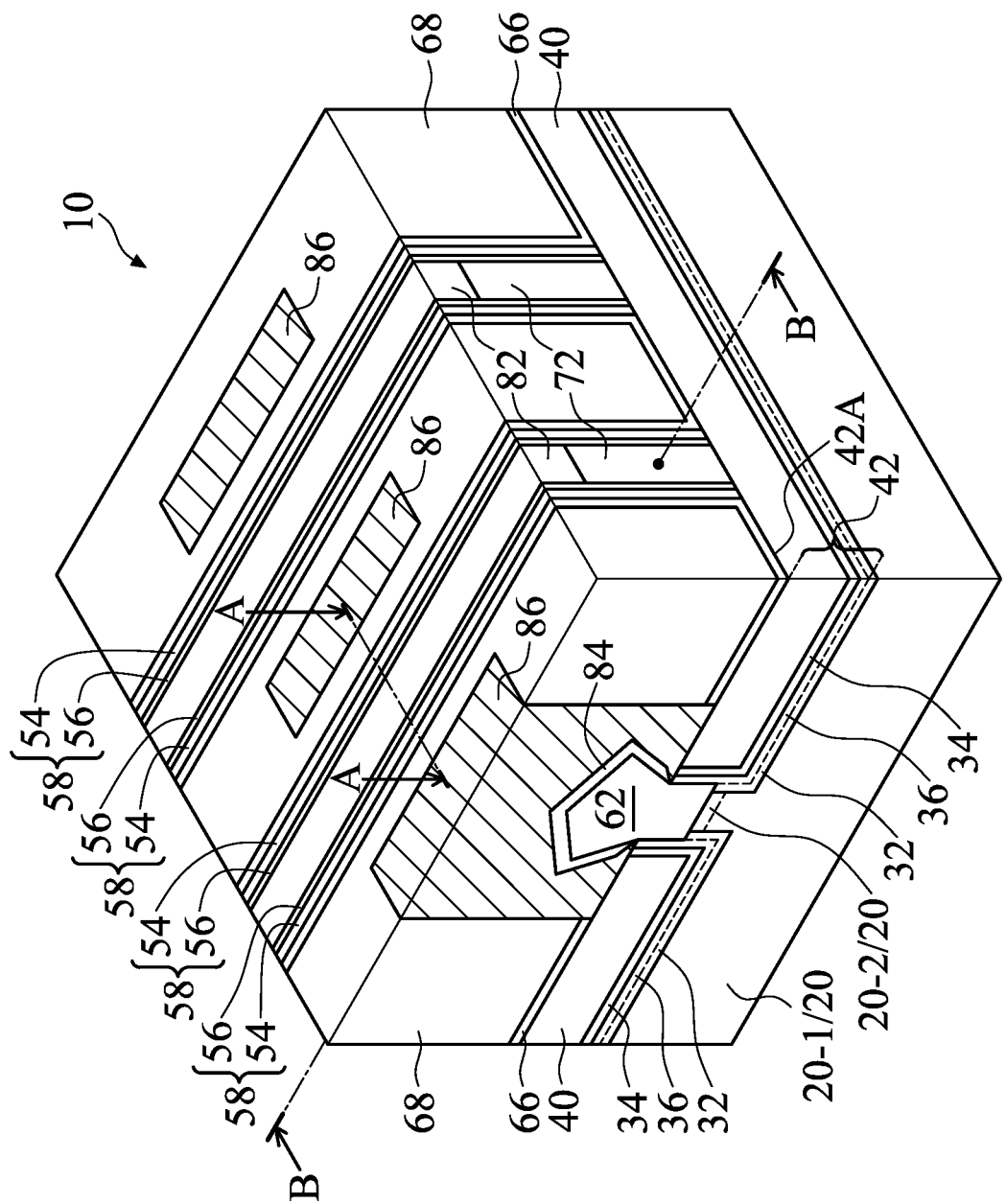

FIG. 16 illustrates the subsequent steps for forming contact plugs. Contact openings are first formed by etching into ILD 68 and CESL 66 to reveal source/drain regions 62. Silicide regions 84 and source/drain contact plugs 86 are then formed to extend into ILD 68 and CESL 66. The respective process is illustrated as process 230 in the process flow shown in FIG. 18. The top edges of silicon nitride layers 36 may be in contact with silicide regions 84 or in contact with source/drain contact plugs 86, depending on where silicide regions 84 extend. Alternatively, the top edges of silicon nitride layers 36 may be in contact with source/drain regions 62.

Figure 17A:
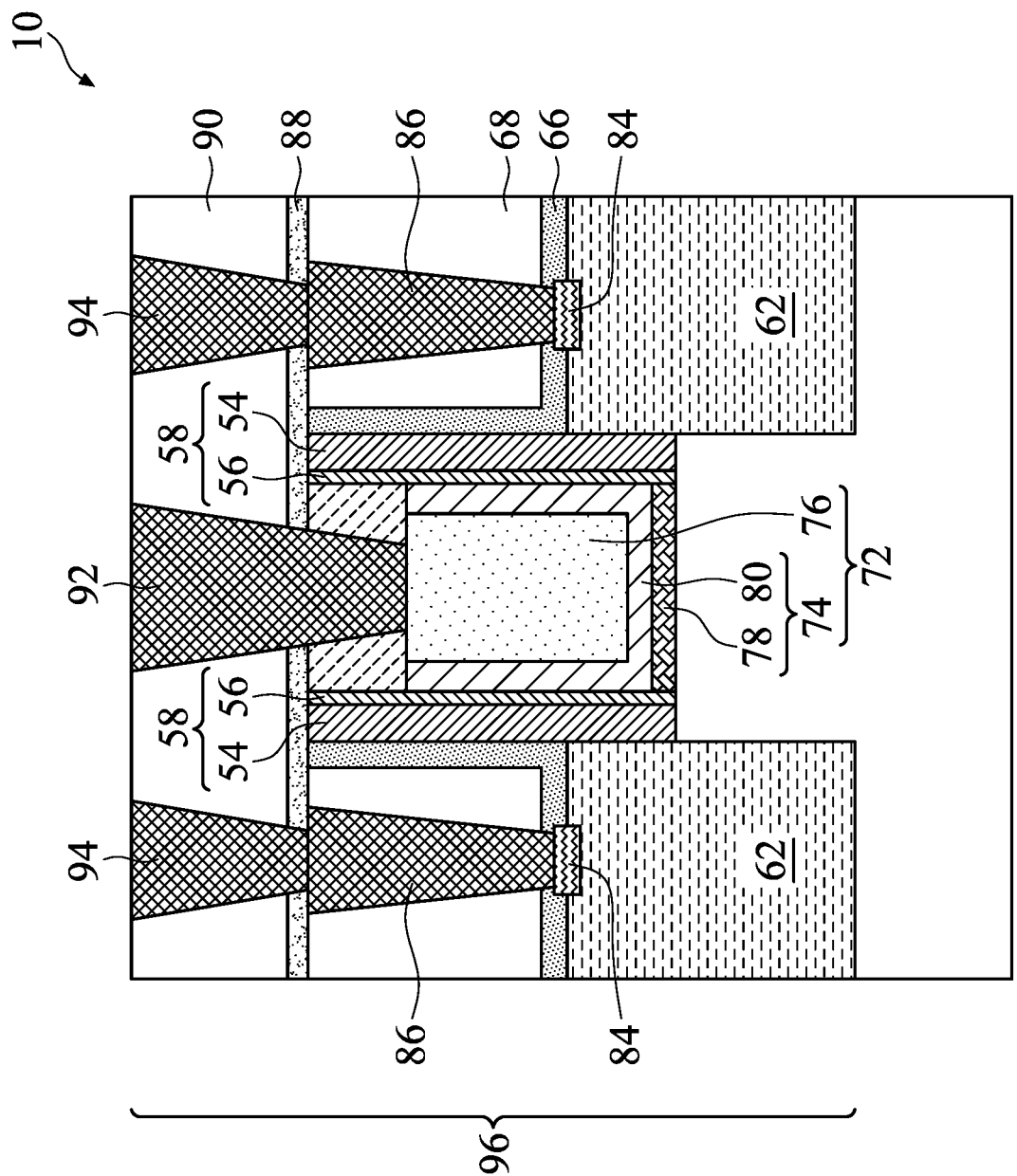
FIGS. 17A and 17B illustrate cross-sectional views of FinFETs in accordance with some embodiments.
Figure 18:
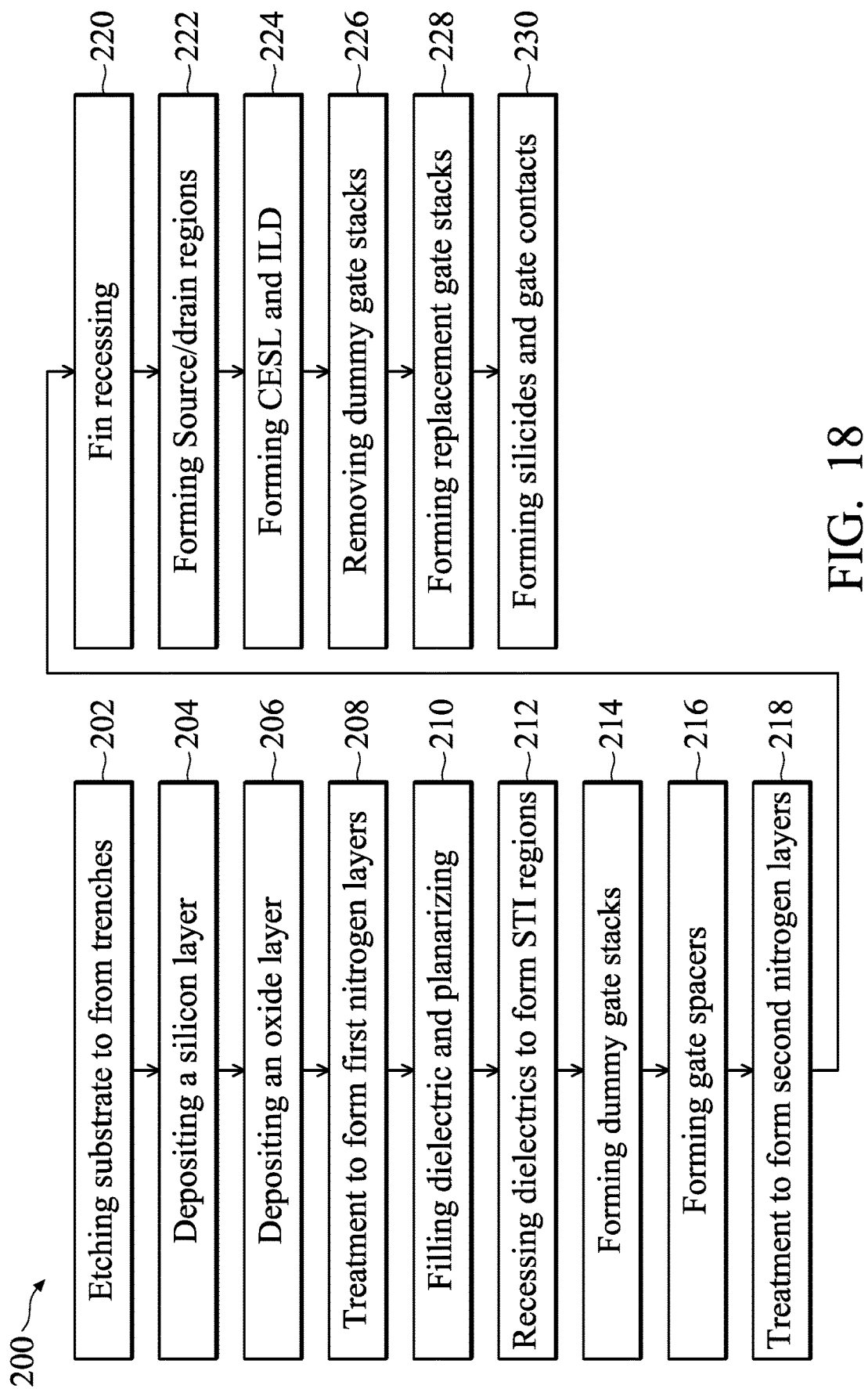
FIG. 18 illustrates a process flow for forming a FinFET in accordance with some embodiments.

In a subsequent step, as shown in FIG. 17A, etch stop layer 88 is formed, followed by the formation of ILD 90. FIG. 17A shows a cross-sectional view obtained from the same plane that contains line A-A in FIG. 16. In accordance with some embodiments of the present disclosure, etch stop layer 88 is formed of SiN, SiCN, SiC, SiOCN, or another dielectric material. The formation method may include PECVD, ALD, CVD, or the like. The material of ILD 90 may be selected from the same candidate materials (and methods) for forming ILD 68, and ILDs 68 and 90 may be formed of the same or different dielectric materials. In accordance with some embodiments of the present disclosure, ILD 90 is formed using PECVD, FCVD, spin-on coating, or the like, and may include silicon oxide ($SiO_2$).

ILD 90 and etch stop layer 88 are etched to form openings. The etching may be performed using, for example, Reactive Ion Etch (RIE). Gate contact plug 92 and source/drain contact plugs 94 are formed in the openings to electrically connect to gate electrodes 76 and source/drain contact plugs 86, respectively. FinFET 96 is thus formed.

Figure 17B:
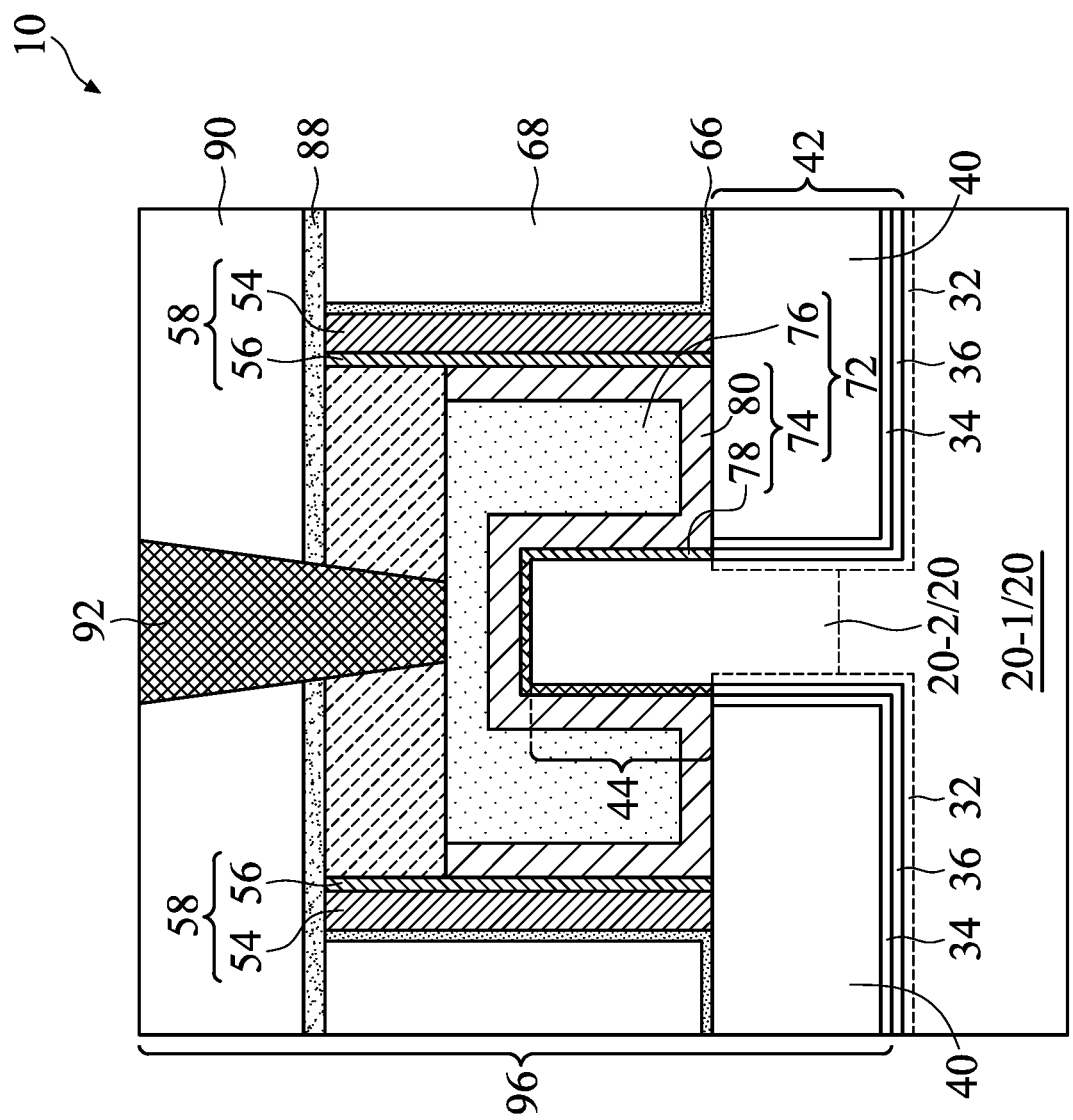

FIG. 17B illustrates a cross-sectional view of FinFET 96 obtained from another plane, which is the same plane that contains line B-B in FIG. 16. FIG. 17B illustrates silicon nitride layers 34 and 56 relative to other features.

The embodiments of the present disclosure have some advantageous features. By forming silicon nitride layers, the advantageous feature of silicon nitride layers for preventing oxygen from reaching and oxidizing fins is achieved. On the other hand, the silicon nitride layers are very thin, and hence do not result in the adverse increase in leakage currents. The thin silicon nitride layer and oxide layer in combination thus form good oxidation-resistant and leakage-proof barriers.

In accordance with some embodiments of the present disclosure, a method includes forming a silicon layer on a wafer, forming an oxide layer in contact with the silicon layer, and, after the oxide layer is formed, annealing the wafer in an environment comprising ammonia ($NH_3$) to form a dielectric barrier layer between, and in contact with, the silicon layer and the oxide layer. The dielectric barrier layer comprises silicon and nitrogen. In accordance with an embodiment, the forming the dielectric barrier layer comprises annealing the wafer in an environment comprising ammonia ($NH_3$). In accordance with an embodiment, the annealing is performed at a temperature in a range between about 500° C. and about 700° C., with an annealing duration in a range between about 20 minutes and about 40 minutes. In accordance with an embodiment, the annealing is performed at a temperature in a range between about 900° C. and about 1,100° C., with an annealing duration in a range between about 1 millisecond and about 5 milliseconds. In accordance with an embodiment, during the annealing, plasma is turned off. In accordance with an embodiment, the forming the dielectric barrier layer comprises: conducting nitrogen atoms to penetrate through the oxide layer, wherein the nitrogen atoms are blocked by the silicon layer. In accordance with an embodiment, the forming the silicon layer comprises epitaxially growing a crystalline silicon layer. In accordance with an embodiment, the forming the silicon layer comprises depositing a polysilicon layer. In accordance with an embodiment, the silicon layer is substantially free from germanium, and the silicon layer is formed on a germanium-containing semiconductor region. In accordance with an embodiment, the silicon layer is a dummy gate electrode, and the method further comprises removing the dummy gate electrode to expose the dielectric barrier layer.

In accordance with some embodiments of the present disclosure, a method includes etching a semiconductor substrate of a wafer to form trenches, wherein a semiconductor strip is located between the trenches; depositing a silicon layer extending on sidewalls of the semiconductor strip; depositing an oxygen-containing dielectric layer on the silicon layer; annealing the wafer in an environment comprising ammonia; forming isolation regions in the trenches; recessing the isolation regions, wherein a top portion of the semiconductor strip higher than top surfaces of the recessed isolation regions form a semiconductor fin; forming a gate stack on the semiconductor fin; and forming source/drain regions based on the semiconductor fin, wherein the source/drain regions are on opposite sides of the gate stack. In accordance with an embodiment, the annealing results in dielectric barrier layer to be formed between the silicon layer and the oxygen-containing dielectric layer. In accordance with an embodiment, the annealing is performed at a temperature in a range between about 500° C. and about 700° C., with an annealing duration in a range between about 20 minutes and about 40 minutes. In accordance with an embodiment, the annealing is performed at a temperature in a range between about 900° C. and about 1,100° C., with an annealing duration in a range between about 1 millisecond and about 5 milliseconds. In an embodiment, the method further includes epitaxially growing a germanium-containing semiconductor layer over a silicon substrate, wherein the germanium-containing semiconductor layer and the silicon substrate in combination form the semiconductor substrate, and the silicon layer is formed to contact a remaining portion of the germanium-containing semiconductor layer in the semiconductor strip.

In accordance with some embodiments of the present disclosure, a device includes a semiconductor substrate; an isolation region extending into the semiconductor substrate, wherein the isolation region comprises: a dielectric barrier layer; and an oxide layer on the dielectric barrier layer; a semiconductor fin protruding higher than a top surface of the dielectric barrier layer; and a semiconductor strip overlapped by the semiconductor fin, wherein the semiconductor strip is in contact with the dielectric barrier layer. In accordance with an embodiment, the semiconductor strip comprises: a lower portion, wherein the lower portion comprises silicon and is free from germanium; and an upper portion comprising: an inner portion formed of a germanium-containing semiconductor material; and an outer portion formed of silicon, and the outer portion is substantially free from germanium, and the outer portion contacts the dielectric barrier layer. In accordance with an embodiment, an interface between the lower portion and the upper portion is at an intermediate level between a top surface and a bottom surface of the isolation region. In accordance with an embodiment, the dielectric barrier layer has a thickness in a range between about 1 Å and about 10 Å. In accordance with an embodiment, the dielectric barrier layer further comprises carbon and oxygen.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising
   forming a silicon layer on a wafer;
   forming an oxide layer in contact with the silicon layer; and
   after the oxide layer is formed, annealing the wafer in an environment comprising ammonia ($NH_3$) to form a dielectric barrier layer between, and in contact with, the silicon layer and the oxide layer, wherein during the annealing, the oxide layer is exposed to the ammonia, and the oxide layer separates the silicon layer from the environment, wherein the dielectric barrier layer comprises silicon and nitrogen, and wherein the dielectric barrier layer has a nitrogen concentration higher than nitrogen concentrations in the oxide layer.

2. The method of claim 1, wherein the silicon layer is formed contacting a semiconductor region of the wafer, and the method further comprises:
   after the annealing, removing the silicon layer, the dielectric barrier layer, and the oxide layer from the semiconductor region of the wafer;
   forming a replacement gate dielectric on the semiconductor region; and
   depositing a replacement gate electrode on the replacement gate dielectric.

3. The method of claim 1, wherein the annealing is performed at a temperature in a range between about 500° C. and about 700° C., with an annealing duration in a range between about 20 minutes and about 40 minutes.

4. The method of claim 1, wherein the annealing is performed at a temperature in a range between about 900° C. and about 1,100° C., with an annealing duration in a range between about 1 millisecond and about 5 milliseconds.

5. The method of claim 1, wherein the annealing is performed in a plasma-free environment.

6. The method of claim 1, wherein the forming the dielectric barrier layer comprises:
   conducting nitrogen atoms to penetrate through the oxide layer, wherein the nitrogen atoms are blocked by the silicon layer.

7. The method of claim 1, wherein after the annealing, a portion of the silicon layer remains being the silicon layer.

8. The method of claim 1, wherein the dielectric barrier layer has a peak nitrogen concentration between the silicon layer and the oxide layer, and atomic percentages of nitrogen gradually reduce from a middle portion of the dielectric barrier layer toward the silicon layer, and atomic percentages of nitrogen gradually reduce from the middle portion of the dielectric barrier layer toward the oxide layer.

9. The method of claim 1, wherein the silicon layer is substantially free from germanium, and the silicon layer is formed on a germanium-containing semiconductor region.

10. The method of claim 1, wherein the silicon layer is a dummy gate electrode, and the method further comprises removing the dummy gate electrode to expose the dielectric barrier layer.

11. A method comprising:
    etching a semiconductor substrate of a wafer to form trenches, wherein a semiconductor strip is located between the trenches;
    depositing a silicon layer extending on sidewalls of the semiconductor strip;
    depositing an oxygen-containing dielectric layer on the silicon layer;
    annealing the wafer in an environment comprising ammonia, wherein in the annealing, nitrogen penetrates through the oxygen-containing dielectric layer to accumulate between the silicon layer and the oxygen-containing dielectric layer;
    forming isolation regions in the trenches;
    recessing the isolation regions, wherein a top portion of the semiconductor strip higher than top surfaces of the recessed isolation regions form a semiconductor fin;
    forming a gate stack on the semiconductor fin; and
    forming source/drain regions based on the semiconductor fin, wherein the source/drain regions are on opposite sides of the gate stack.

12. The method of claim 11, wherein the annealing results in a dielectric barrier layer to be formed between the silicon layer and the oxygen-containing dielectric layer, wherein the dielectric barrier layer comprises the penetrated nitrogen.

13. The method of claim 11, wherein the annealing is performed at a temperature in a range between about 500° C. and about 700° C., with an annealing duration in a range between about 20 minutes and about 40 minutes.

14. The method of claim 11, wherein when the annealing is performed, the silicon layer is covered by the oxygen-containing dielectric layer.

15. The method of claim 11 further comprising epitaxially growing a germanium-containing semiconductor layer over a silicon substrate, wherein the germanium-containing semiconductor layer and the silicon substrate in combination form the semiconductor substrate, and the silicon layer is formed to contact a remaining portion of the germanium-containing semiconductor layer in the semiconductor strip.

16. A method comprising:
    forming a semiconductor strip as a surface part of a wafer;
    depositing a silicon layer on the semiconductor strip, wherein the silicon layer comprises horizontal portions on top surfaces of the wafer, and vertical portions on sidewalls of the semiconductor strip;
    depositing an oxide layer on the silicon layer; and
    forming a dielectric barrier layer between the silicon layer and the oxide layer, wherein the dielectric barrier layer comprises silicon and nitrogen, and the dielectric barrier layer has a peak nitrogen concentration at a position, and wherein the position is between and spaced apart from both of the silicon layer and the oxide layer.

17. The method of claim 16, wherein atomic percentages of nitrogen gradually reduce from the position toward the silicon layer, and from the position toward the oxide layer.

18. The method of claim 16, wherein the dielectric barrier layer is formed after the oxide layer is formed.

19. The method of claim 16, wherein the forming the dielectric barrier layer comprises annealing the wafer in a nitrogen-containing environment, and wherein during the annealing, the oxide layer is exposed to a nitrogen-containing gas, and the silicon layer is covered by the oxide layer.

20. The method of claim 16, wherein the silicon layer is substantially free from germanium.

\* \* \* \* \*